(12) United States Patent
Appenzeller et al.

(10) Patent No.: US 8,637,374 B2
(45) Date of Patent: Jan. 28, 2014

(54) METHOD OF FABRICATING SELF-ALIGNED NANOTUBE FIELD EFFECT TRANSISTOR

(75) Inventors: Joerg Appenzeller, Valhalla, NY (US); Phaedon Avouris, Yorktown Heights, NY (US); Kevin K. Chan, Staten Island, NY (US); Philip G. Collins, Oakland, CA (US); Richard Martel, Peekskill, NY (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 13/368,901

(22) Filed: Feb. 8, 2012

(65) Prior Publication Data

US 2012/0142158 A1 Jun. 7, 2012

Related U.S. Application Data

(62) Division of application No. 12/544,436, filed on Aug. 20, 2009, now Pat. No. 8,138,491, which is a division of application No. 11/835,167, filed on Aug. 7, 2007, now Pat. No. 7,635,856, which is a division of application No. 10/956,851, filed on Oct. 1, 2004, now Pat. No. 7,253,065, which is a division of application No. 10/102,365, filed on Mar. 20, 2002, now Pat. No. 6,891,227.

(51) Int. Cl.
*H01L 21/336* (2006.01)
*H01L 21/44* (2006.01)
*H01L 21/302* (2006.01)
*H01L 21/461* (2006.01)

(52) U.S. Cl.
USPC ........... 438/299; 438/709; 438/666; 438/745; 257/E21.4; 257/E21.408; 977/842

(58) Field of Classification Search
USPC ................. 438/299, 666, 706, 745, 778, 787; 257/E21.4, E21.408; 977/842
See application file for complete search history.

(56) References Cited

U.S. PATENT DOCUMENTS

| | | | |
|---|---|---|---|
| 4,581,076 A | 4/1986 | Badawi | |
| 6,025,235 A | 2/2000 | Krivokapic | |
| 6,515,325 B1 | 2/2003 | Farnworth et al. | |
| 6,515,339 B2 | 2/2003 | Shin et al. | |

(Continued)

FOREIGN PATENT DOCUMENTS

| | | |
|---|---|---|
| DE | 100 36 897 | 1/2002 |
| EP | 1 124 262 | 8/2001 |

(Continued)

OTHER PUBLICATIONS

English Abstract for Publication No. WO 2002/011216.

(Continued)

*Primary Examiner* — Shouxiang Hu
(74) *Attorney, Agent, or Firm* — F. Chau & Associates, LLC; Vazken Alexanian, Esq.

(57) ABSTRACT

A self-aligned carbon-nanotube field effect transistor semiconductor device comprises a carbon-nanotube deposited on a substrate, a source and a drain formed at a first end and a second end of the carbon-nanotube, respectively, and a gate formed substantially over a portion of the carbon-nanotube, separated from the carbon-nanotube by a dielectric film.

4 Claims, 37 Drawing Sheets

(56) References Cited

U.S. PATENT DOCUMENTS

| | | | |
|---|---|---|---|
| 6,524,920 | B1 | 2/2003 | Yu |
| 6,566,704 | B2 | 5/2003 | Choi et al. |
| 6,740,910 | B2 | 5/2004 | Roesner et al. |
| 7,081,385 | B2 * | 7/2006 | Farnworth et al. ............ 438/253 |
| 7,635,704 | B2 | 12/2009 | Satoh et al. |
| 2001/0023986 | A1 | 9/2001 | Mancevski |
| 2002/0001905 | A1 | 1/2002 | Choi et al. |
| 2002/0163079 | A1 * | 11/2002 | Awano ........................ 257/750 |
| 2002/0173083 | A1 * | 11/2002 | Avouris et al. ............... 438/129 |
| 2003/0130333 | A1 | 7/2003 | Chan et al. |
| 2003/0148562 | A1 | 8/2003 | Luyken et al. |
| 2004/0043588 | A1 | 3/2004 | Wang et al. |
| 2004/0144972 | A1 | 7/2004 | Dai et al. |

FOREIGN PATENT DOCUMENTS

| | | |
|---|---|---|
| JP | 8-107064 | 4/1986 |
| JP | 2002110977 | 4/2002 |
| WO | WO 00/51186 | 8/2000 |
| WO | WO 01/39264 | 5/2001 |
| WO | WO 02/03482 | 1/2002 |
| WO | WO 02/11216 | 2/2002 |
| WO | WO 03/010837 | 2/2003 |

OTHER PUBLICATIONS

English Abstract for Publication No. JP2002110977.
Xuejue Huang et al., "SUB 50-nm FinFET:PMOS," pp. 67-70, 1999, IEDM Technical Digest International; Washington DC, USA Dec. 5-8, 1999, Piscataway, NJ.
Richard Martel, et al., "Carbon Nanotude Field Effect Transistors for Logic Applications," pp. 159-162, IEDM, Technical Digest, Washington, DC, Dec. 2-5, 2001—New York, NY:IEEE, US, Dec. 2, 2001, pp.
J.W. Park, et al., "Effects of Artificial Defects on the Electrical Transport of Single-Walled Carbon Nanotubes," pp. 133-135, Applied Physics Letters, vol. 80, No. 1, Jan. 7, 2002.
Richard Martel et al., "Single-and Multi-Wall Carbon Nanotube Field-Effect Transistors," Applied Physics Letters, vol. 73, No. 17, Oct. 26, 1998.
Sanders J. Tans, et al., "Room-Temperature Transistor Based on Single Carbon Nanotube," nature, vol. 393, May 1998.
Won Bong Choi, et al., "Ultrahigh-Density Nanotransistors by Using Selectively Grown Vertical Carbon Nanotubes," Applied Physics Letters, vol. 79, No. 22, Nov. 2001, pp. 3396-3698.
L. Roschier, et al., Multiwalled Carbon Nanotubes as Ultrasensitive Electrometers, Applied Physics Letters, vol. 78, No. 21, May 2001, pp. 3295-3297.
English Abstract for Publication No. WO 02/03482.
English Abstract for Publication No. 8-107064.

* cited by examiner

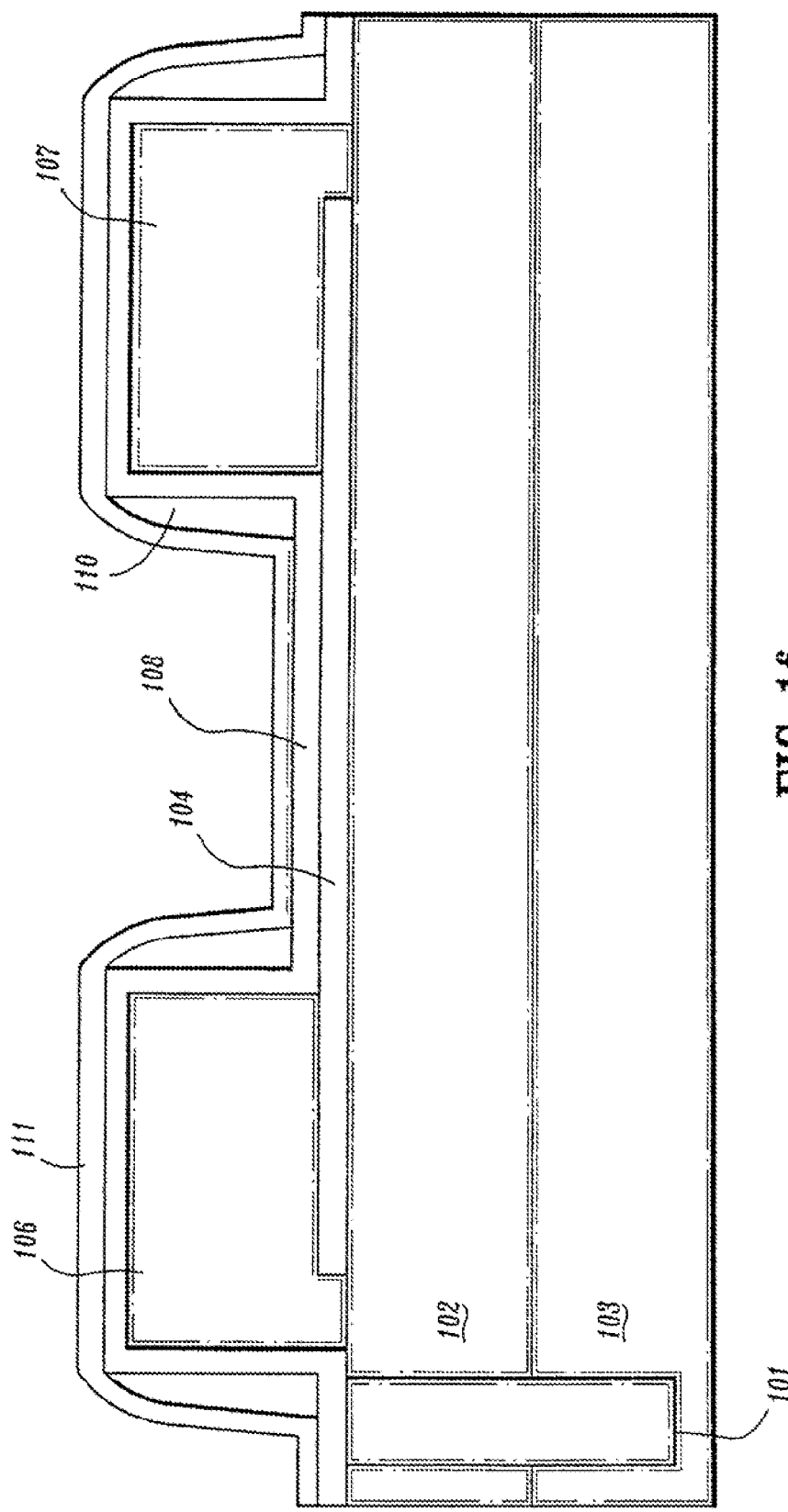

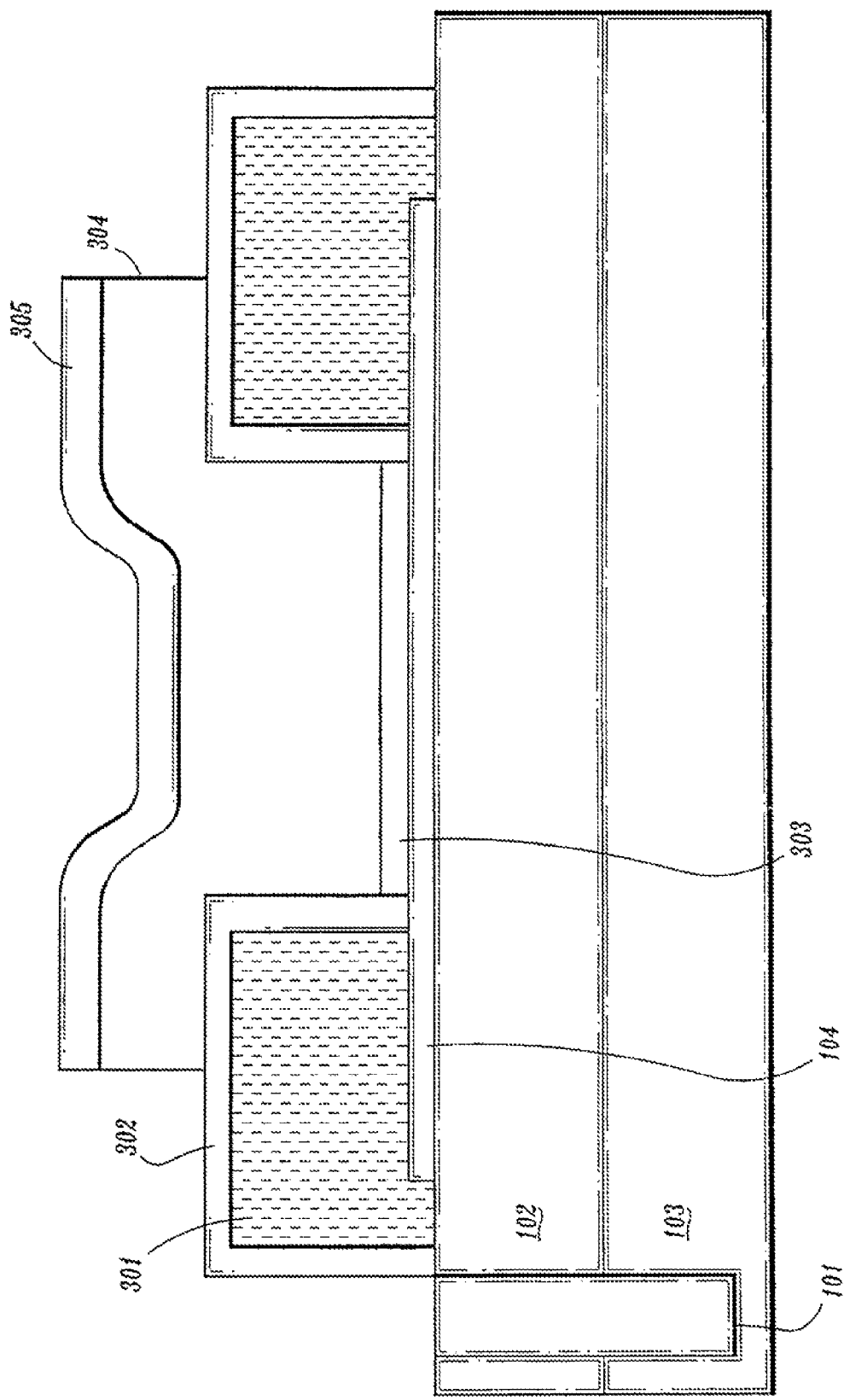

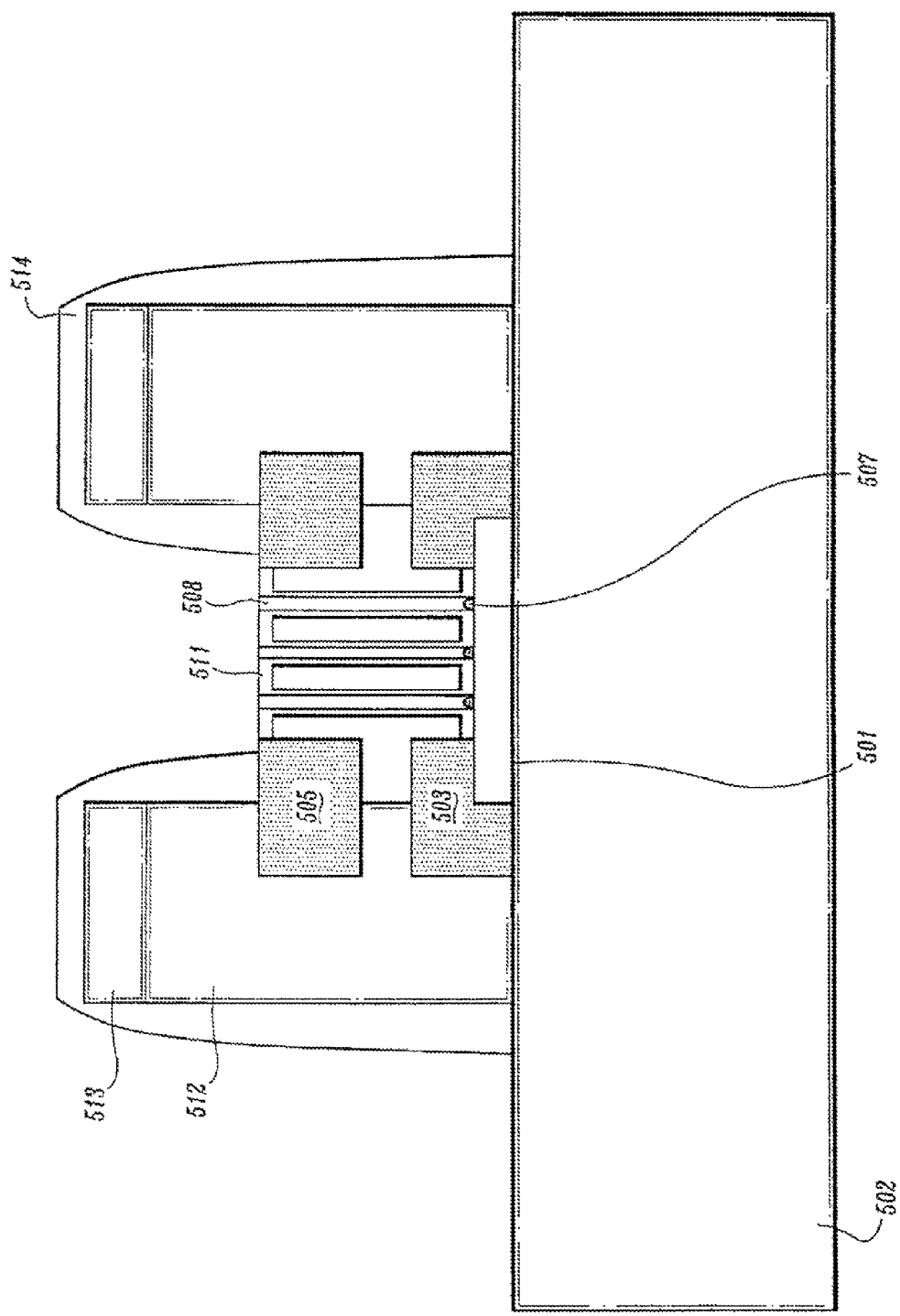

METHOD OF FABRICATING SELF-ALIGNED NANOTUBE FIELD EFFECT TRANSISTOR

CROSS-REFERENCE TO RELATED APPLICATION

This is a Divisional Application of U.S. application Ser. No. 12/544,436, filed Aug. 20, 2009, issued as U.S. Pat. No. 8,138,491, which is a Divisional Application of U.S. application Ser. No. 11/835,167, filed Aug. 7, 2007, issued as U.S. Pat. No. 7,635,856, which is a Divisional Application of U.S. application Ser. No. 10/956,851, filed Oct. 1, 2004, issued as U.S. Pat. No. 7,253,065, which is a Divisional Application of U.S. application Ser. No. 10/102,365, filed Mar. 20, 2002, issued as U.S. Pat. No. 6,891,227, the disclosures of which are herein incorporated by reference in their entirety.

BACKGROUND

1. Technical Field

The present invention relates to field effect transistors, and more particularly, to carbon-nanotube field effect transistors.

2. Discussion of Related Art

In the field of molecular nanoelectronics, few materials show as much promise as nanotubes, and in particular carbon nanotubes, which comprise hollow cylinders of graphite, angstroms in diameter. Nanotubes can be implemented in electronic devices such as diodes and transistors, depending on the nanotube's electrical characteristics. Nanotubes are unique for their size, shape, and physical properties. Structurally a carbon-nanotube resembles a hexagonal lattice of carbon rolled into a cylinder.

Besides exhibiting intriguing quantum behaviors at low temperature, carbon nanotubes exhibit at least two important characteristics: a nanotube can be either metallic or semiconductor depending on its chirality (i.e., conformational geometry). Metallic nanotubes can carry extremely large current densities with constant resistivity. Semiconducting nanotubes can be electrically switched on and off as field-effect transistors (FETs). The two types may be covalently joined (sharing electrons). These characteristics point to nanotubes as excellent materials for making nanometer-sized semiconductor circuits.

In addition, carbon nanotubes are one-dimensional electrical conductors, meaning that only one-dimensional quantum mechanical mode carries the current. This can be a significant advantage with respect to the device performance of a carbon-nanotube based transistor since scattering in the material is significantly suppressed. Less scattering means a better performance of the device.

For a three terminal device, such as an FET, a gate (the third terminal) needs to be isolated from the electrically active channel region as well as a source and a drain. For this purpose a dielectric material, e.g., silicon dioxide can be used. To improve device characteristics in silicon devices, the thickness of this layer can be reduced. This reduction increases the gate capacitance and improves the gate-to-channel coupling. For standard silicon field-effect devices the gate capacitance scales inversely proportional to the dielectric film thickness. For currently manufactured high-performance processors, the $SiO_2$ thickness is less than 4 nm. Significantly, further reduction can be difficult to achieve since gate leakage through the dielectric film increases exponentially for an oxide thickness below 4 nm.

However, the gate capacitance for a carbon-nanotube transistor does not scale inversely proportional with the dielectric film thickness. Instead, carbon-nanotubes follow a logarithmic scaling law. In comparison with a standard silicon field-effect transistor, the gate capacitance for a carbon-nanotube transistor can be larger because of the cylindrical geometry of these objects.

No known system or method has implemented a nanotube to achieve performance and smaller size in an FET. Therefore, a need exists for a system and method of preparing nanotube based FETs.

BRIEF SUMMARY

According to an embodiment of the present invention, a self-aligned carbon-nanotube field effect transistor semiconductor device is provided. The device comprises a carbon-nanotube deposited on a substrate, a source and a drain formed at a first end and a second end of the carbon-nanotube, respectively, and a gate formed substantially over a portion of the carbon-nanotube, separated from the carbon-nanotube by a dielectric film.

The substrate comprises a thermal oxide deposited over a silicon substrate. The thermal oxide is about 150 nanometers thick.

The gate is further separated from the carbon-nanotube by an oxide layer. A portion of the gate is separated from the source and the drain by a nitride spacer.

The device further comprises a passivation dielectric layer over the device.

The device comprises an alignment mark in the substrate to which the source and the drain are aligned.

The gate wraps around the dielectric film and the carbon-nanotube to contact a back side of the carbon-nanotube.

According to an embodiment of the present invention, a carbon-nanotube field effect transistor semiconductor device is provided. The device comprises a vertical carbon-nanotube wrapped in a dielectric material, a source and a drain formed on a first side and a second side of the carbon-nanotube, respectively, a bilayer nitride complex through which a band strap of each of the source and the drain is formed connecting the carbon-nanotube wrapped in the dielectric material to the source and the drain, and a gate formed substantially over a portion of the carbon-nanotube.

The device comprises a metal catalyst at a base of the carbon-nanotube.

According to one embodiment of the present invention, a method is provided for forming a self-aligned carbon-nanotube field effect transistor semiconductor device. The method comprises depositing a nanotube on a thermal oxide substrate, wherein the substrate includes an alignment mark, forming a metal contact at each end of the nanotube, wherein a first metal contact is a source and a second metal contact is a drain, and depositing an amorphous silicon layer over the device. The method further comprises forming nitride spacers on opposing sides of each metal contact, depositing a high k dielectric film over the device, oxidizing the amorphous silicon, and forming a gate substantially between the source and the drain, and over the nanotube.

The method comprises depositing a passivation dielectric over the device.

The nanotube is a single-walled nanotube. The metal contacts are formed using a photoresist.

According to an embodiment of the present invention, a method is provided for forming a self-aligned carbon-nanotube field effect transistor semiconductor device. The method comprises depositing a nanotube on a thermal oxide substrate, wherein the substrate includes an alignment mark, forming a metal contact by reactive ion etch at each end of the nanotube, wherein a first metal contact is a source and a second metal contact is a drain, and forming nitride spacers on opposing sides of each metal contact. The method further comprises depositing a high k dielectric film over the device, and forming a gate substantially between the source and the drain and over the nanotube.

The method comprises depositing a passivation dielectric over the device.

According to an embodiment of the present invention, a method is provided for forming a self-aligned carbon-nanotube field effect transistor semiconductor device. The method comprises depositing a nanotube on a thermal oxide substrate, wherein the substrate includes an alignment mark, and forming an amorphous silicon pillar over each end of the nanotube. The method further comprises isolating the amorphous silicon pillars with a layer of oxide, forming a gate dielectric layer between amorphous silicon pillars, and forming a gate substantially between the amorphous silicon pillars and over the nanotube. The method comprises forming a nitride layer over the gate, forming oxide spacers on each side of the gate, replacing the amorphous silicon with metal contacts, wherein a first metal contact is a source and a second metal contact is a drain, and depositing a passivation dielectric over the device.

According to another embodiment of the present invention, a method is provided for forming a self-aligned carbon-nanotube field effect transistor semiconductor device. The method comprises depositing a metal catalyst on a thermal oxide substrate, depositing a low temperature oxide layer over the device, etching a trench through the oxide, the metal catalyst and into a thermal oxide underlying the metal catalyst, and etching the low temperature oxide layer to form oxide islands. The method further comprises stripping exposed metal catalyst, growing a nanotube between metal catalyst beneath the oxide islands, and wrapping the nanotube in a gate dielectric. The method comprises forming nitride spacers on the opposing surfaces of the oxide islands, forming a gate substantially between the oxide islands by chemical vapor deposition and over the nanotube, and depositing a passivation dielectric over the device.

According to an embodiment of the present invention, a method is provided for forming a self-aligned carbon-nanotube field effect transistor semiconductor device. The method comprises growing a nanotube vertically from a metal catalyst forming on a surface of the semiconductor device, forming a nitride block structure, and wrapping the nanotube in a gate dielectric. The method comprises depositing a gate metal separated from the metal catalyst by the dielectric layer, depositing a nitride layer, and forming gate metal pillars capped with the nitride layer. The method forms nitride spacers around the pillars, deposits a drain metal substantially between the pillars separated from the gate metal by the dielectric layer, and deposits a passivation dielectric over the device.

BRIEF DESCRIPTION OF THE SEVERAL VIEWS OF THE DRAWINGS

Preferred embodiments of the present invention will be described below in more detail, with reference to the accompanying drawings:

FIGS. 1a-i illustrate a source/drain first carbon-nanotube field effect transistor according to an embodiment of the present invention;

FIGS. 3a-g illustrate a gate first carbon-nanotube field effect transistor according to an embodiment of the present invention;

DETAILED DESCRIPTION

Figure 1A:
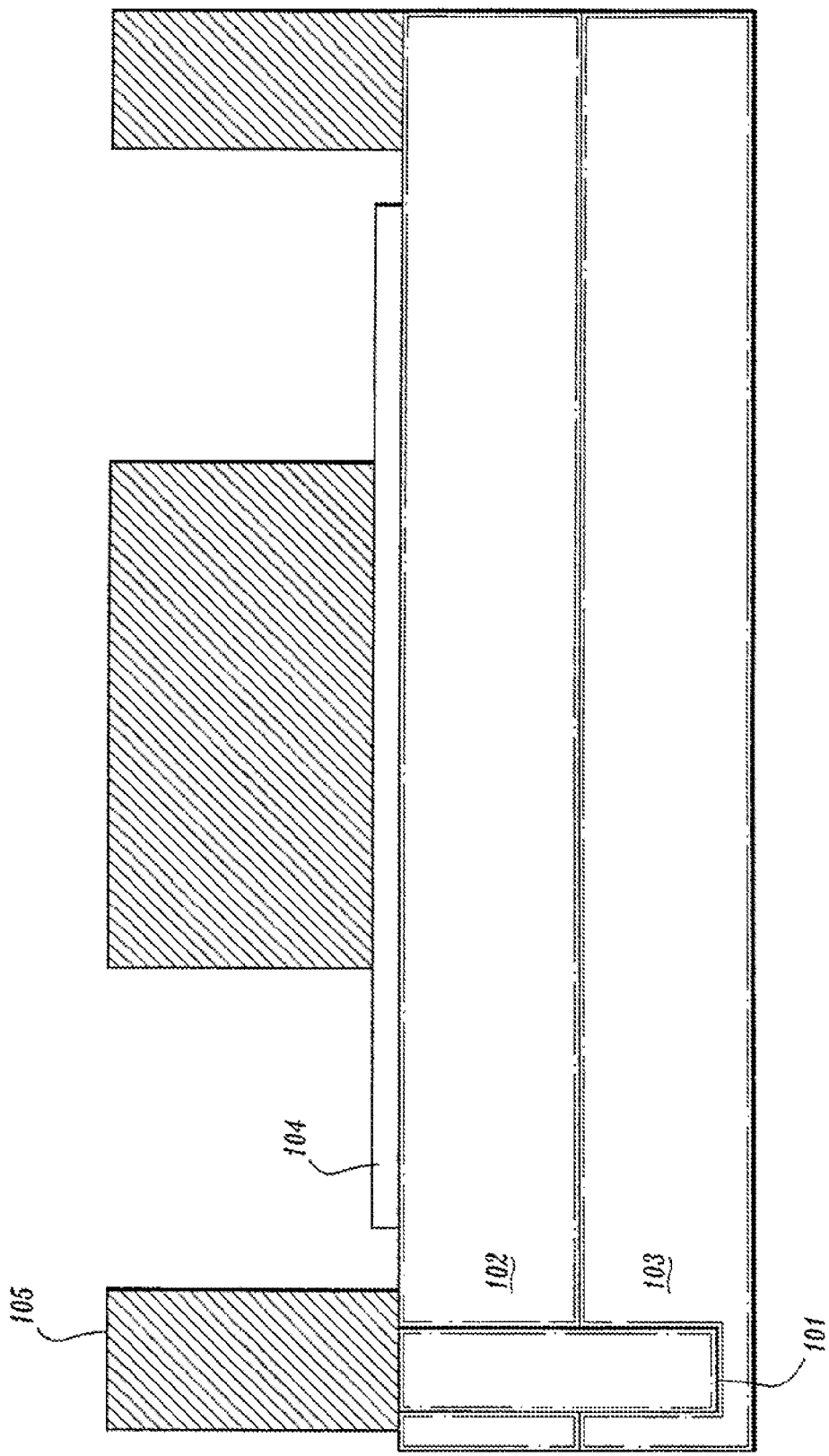
Figure 1B:
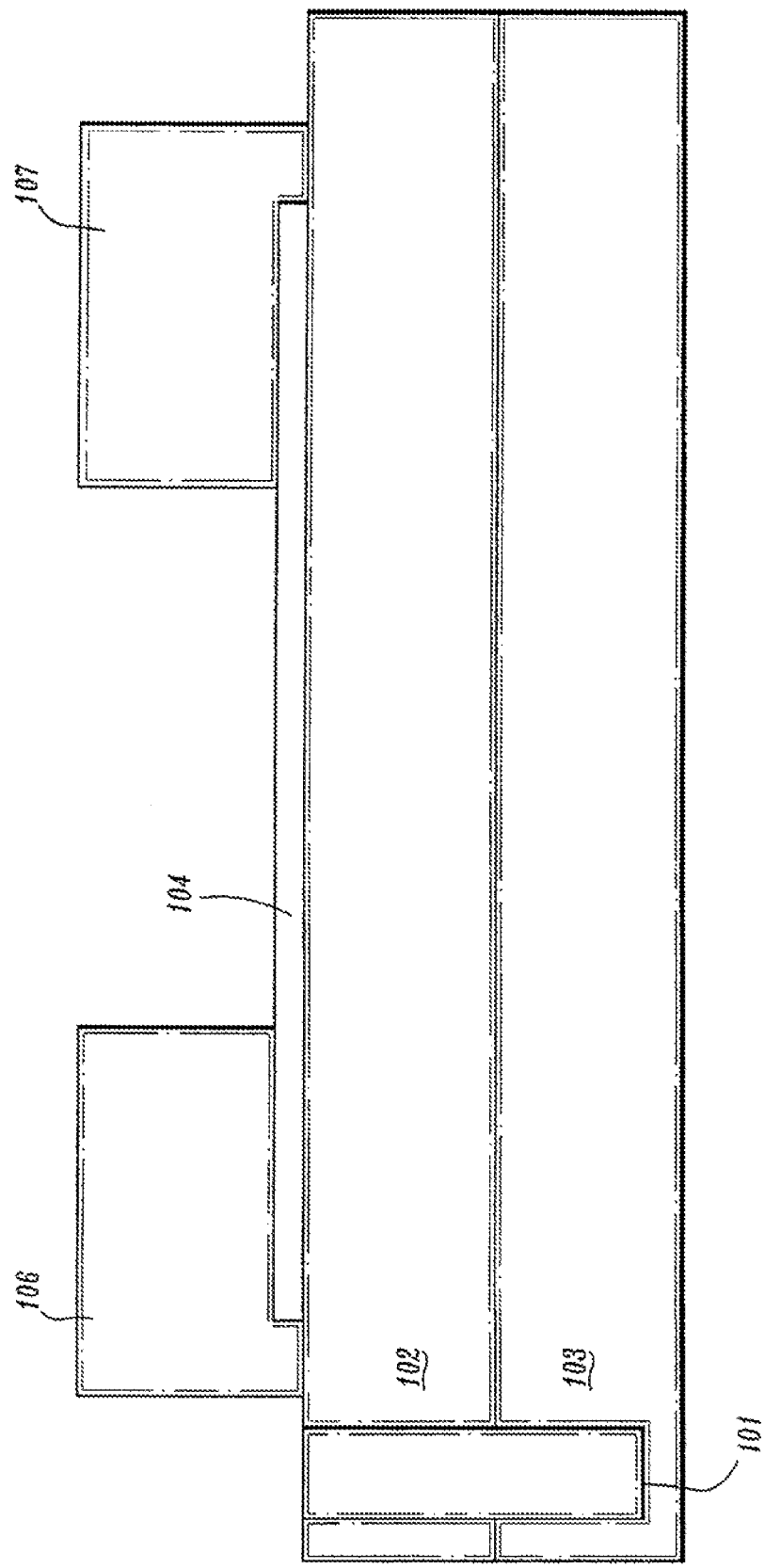
Figure 1C:
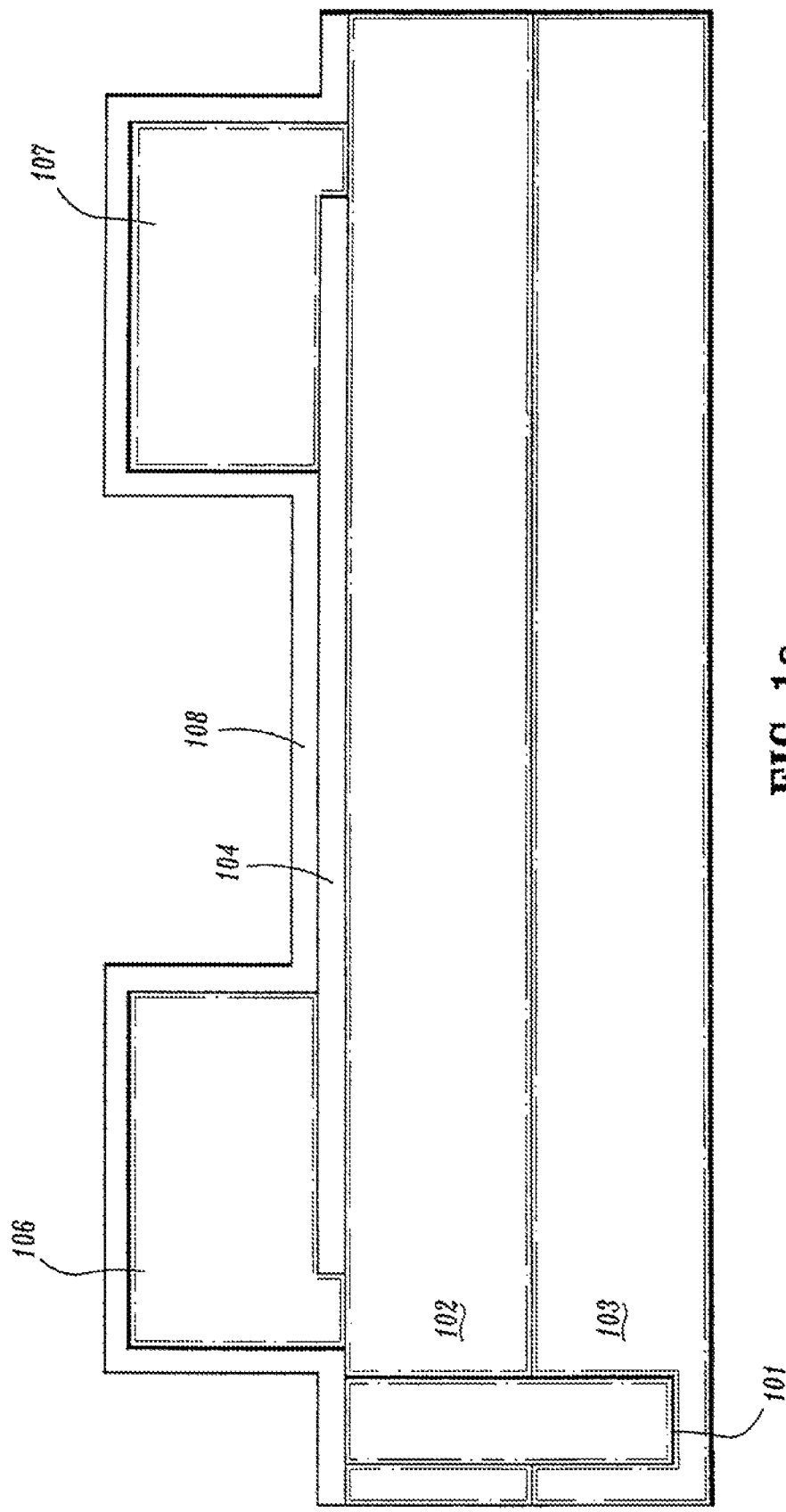
Figure 1D:
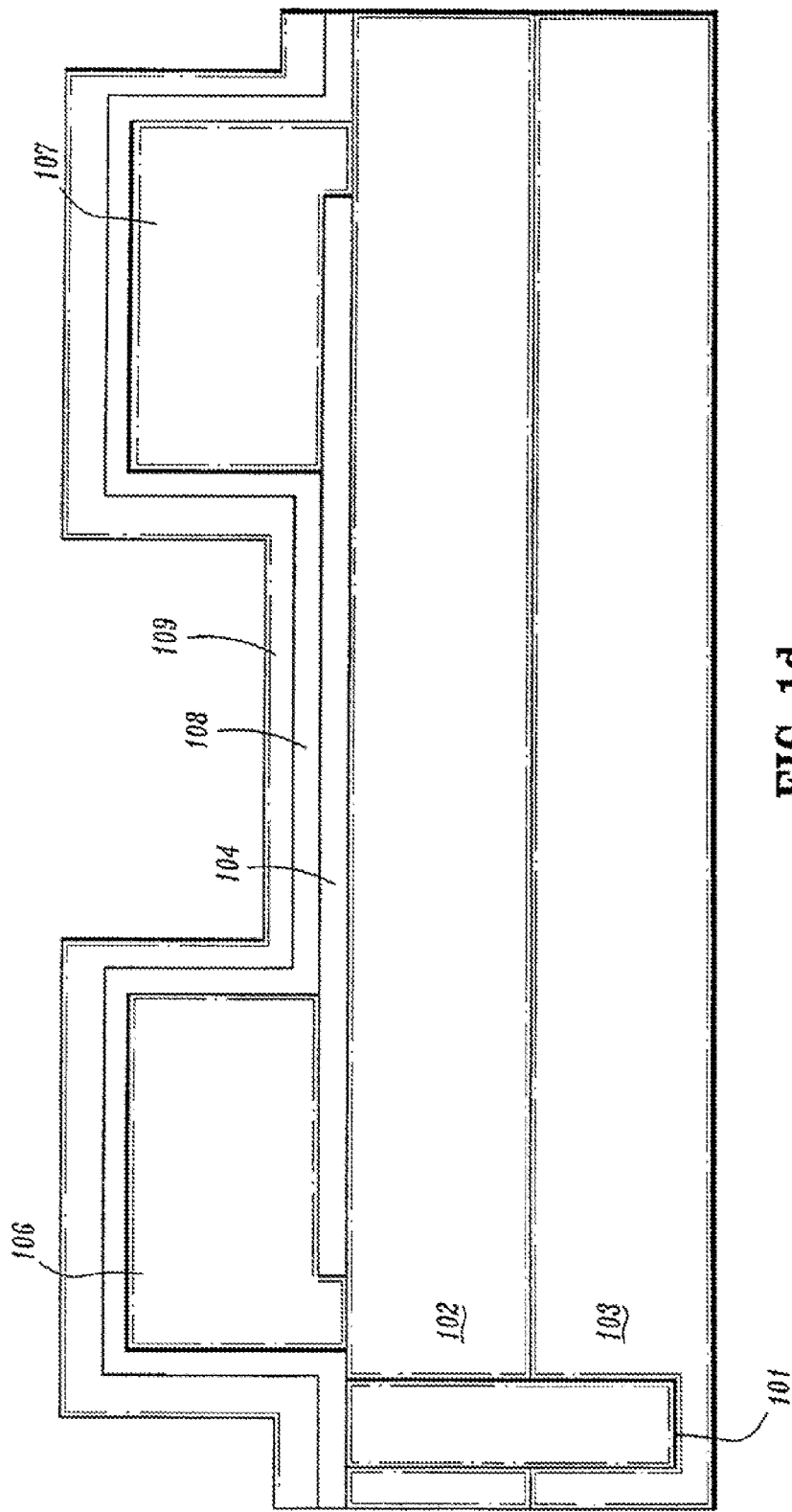
Figure 1E:
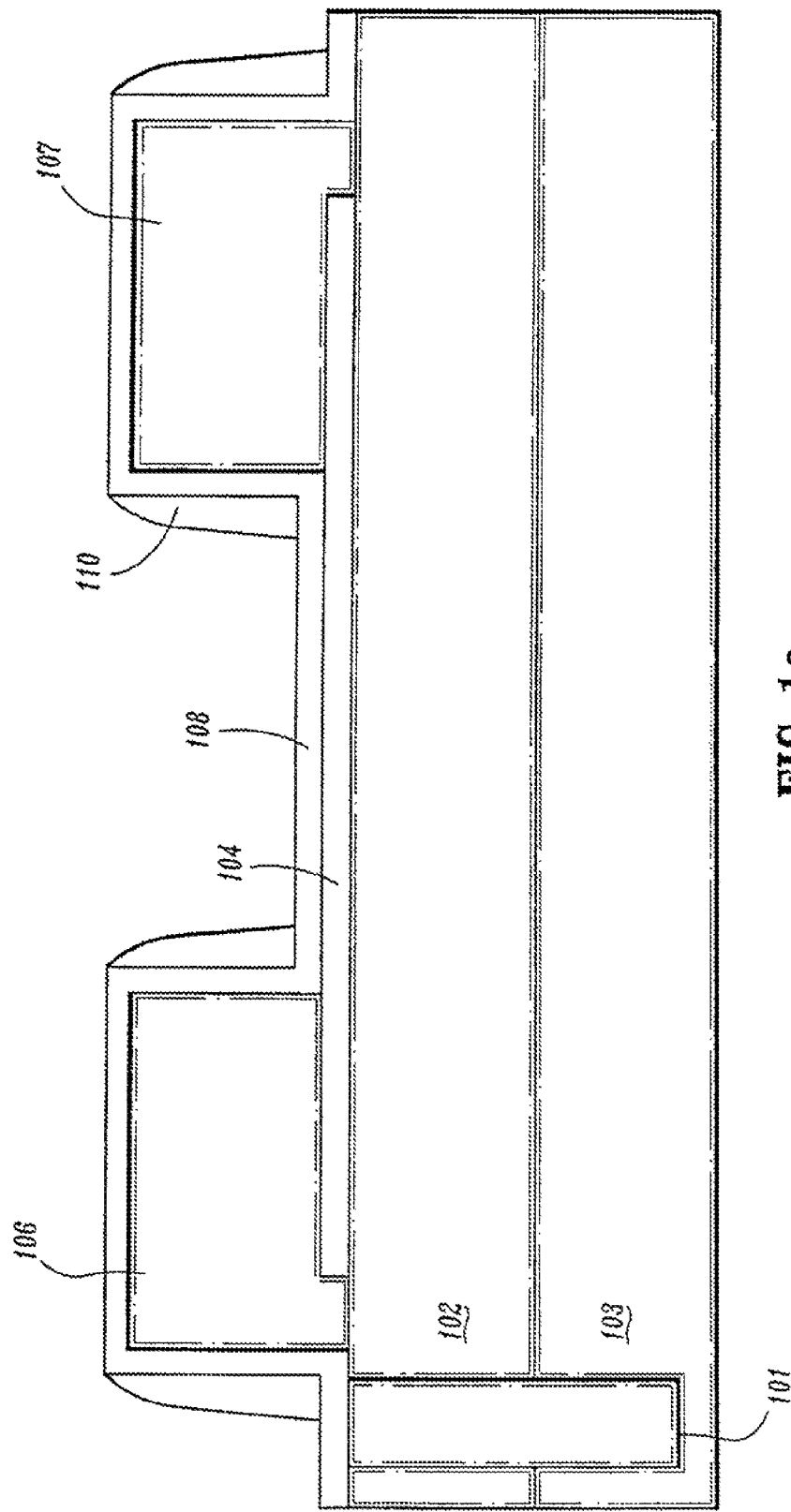
Figure 1G:
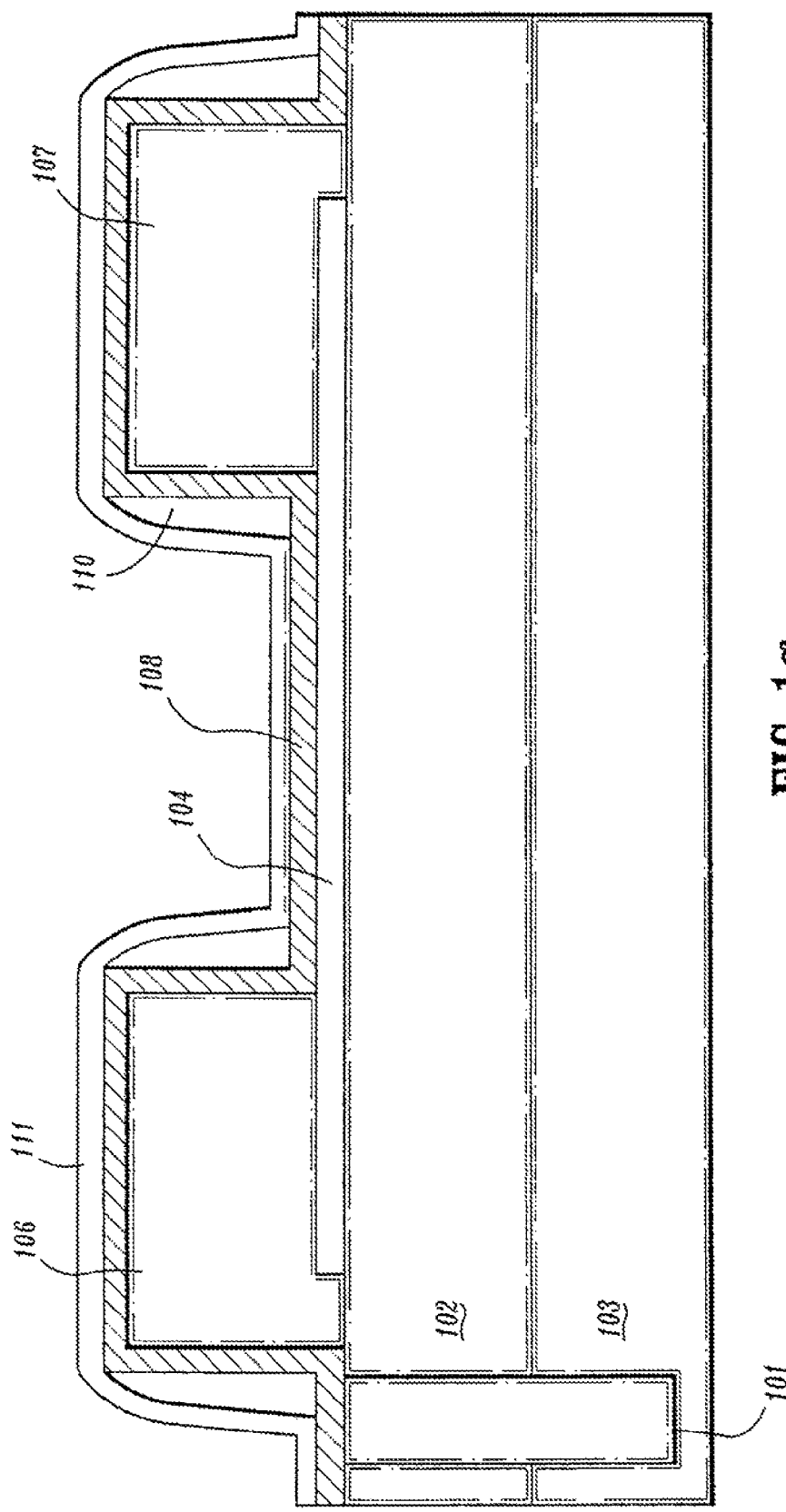
Figure 1H:
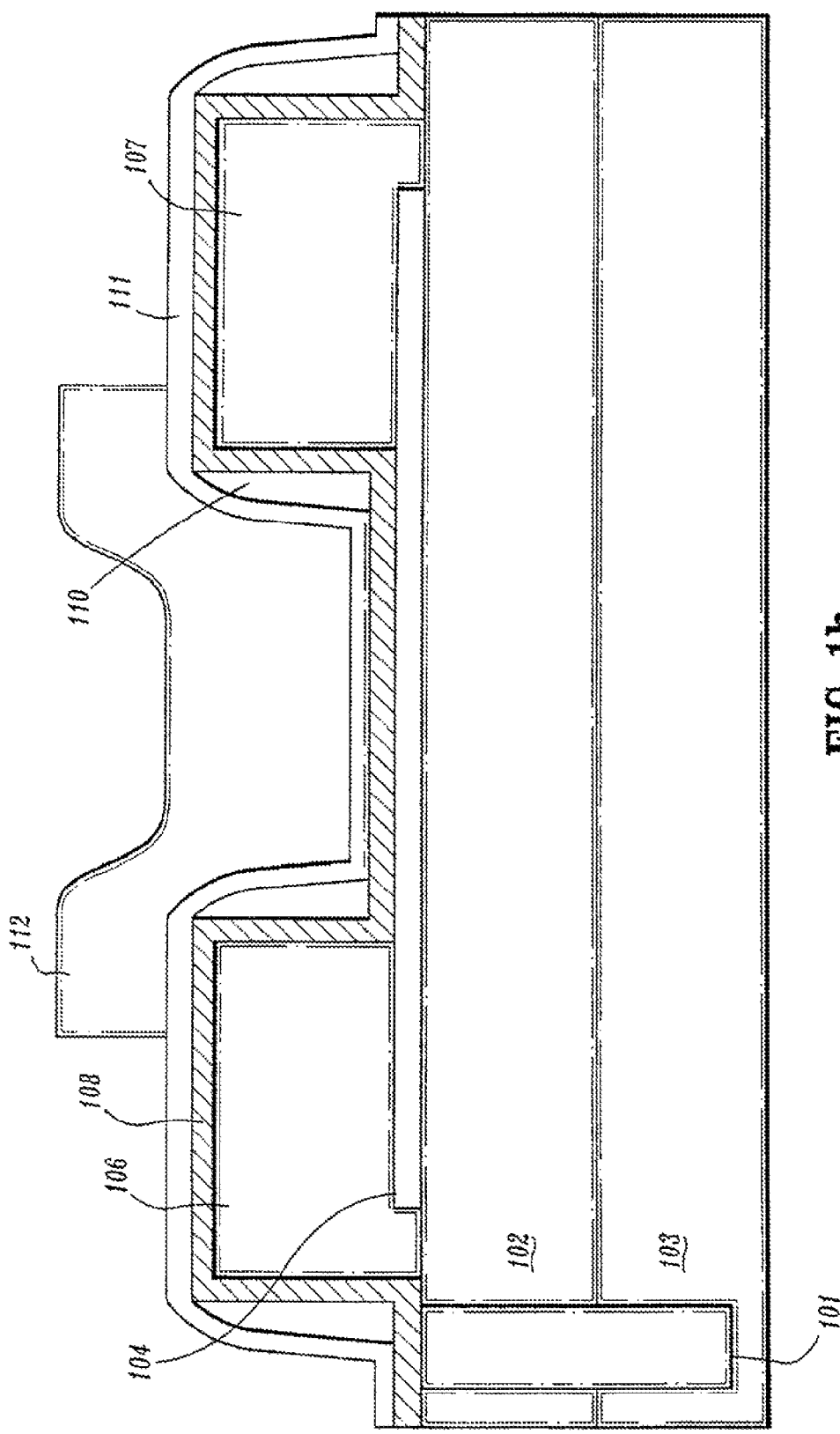
Figure 1I:
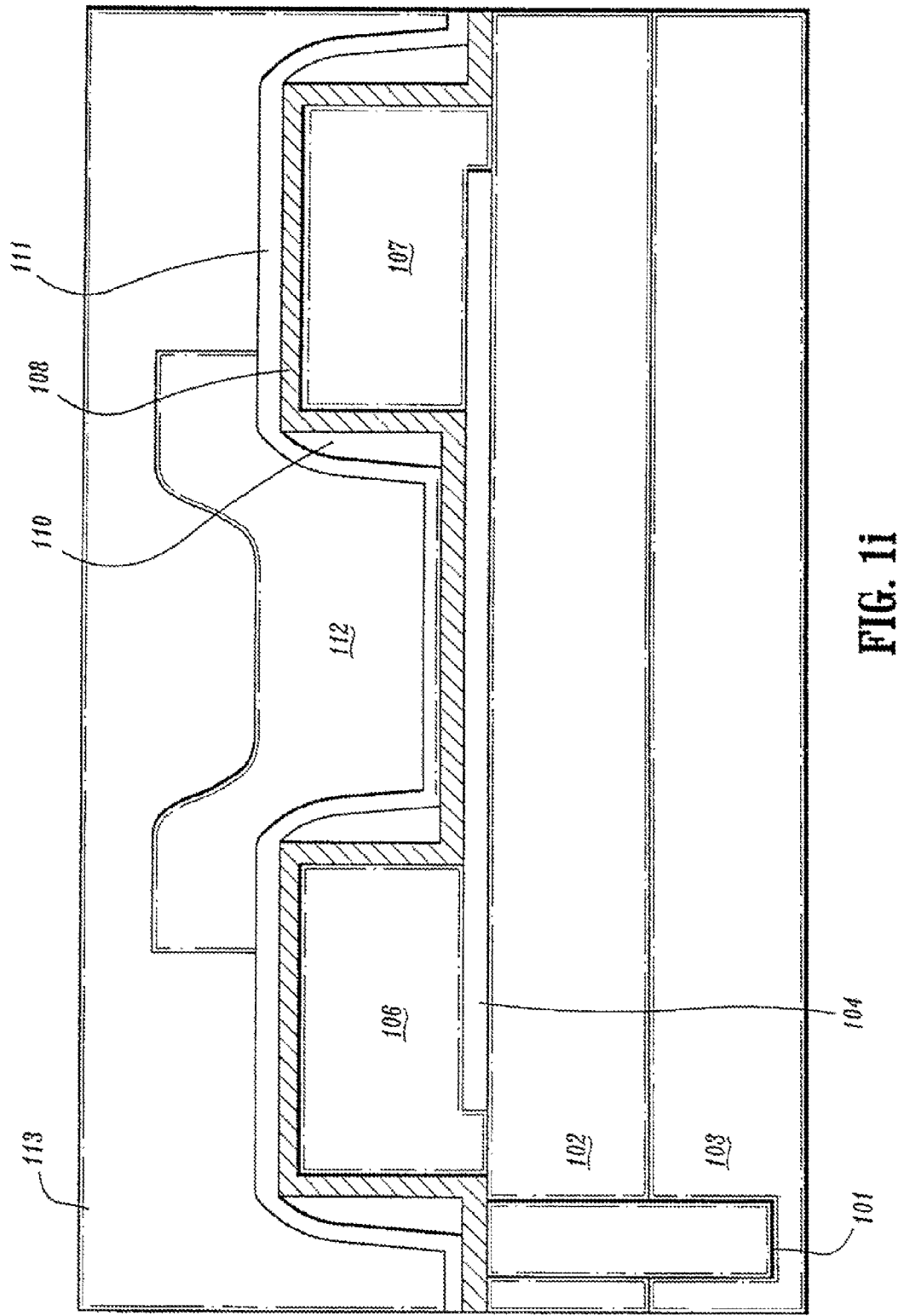

According to an embodiment of the present invention, a gate, a source and a drain of a field effect transistor (FET) are self-aligned, thereby reducing overlap capacitances.

According to an embodiment of the present invention, a carbon-nanotube FET can be fabricated using a pattern transfer by lift-off etch, wherein the source and the drain are formed before the gate. Referring to FIGS. 1a-i, an alignment mark 101 is formed in a thermal oxide 102 and silicon substrate 103. The alignment mark 101 is a high precision feature that can be used as a reference when positioning patterns. The thermal oxide 102 is deposited over the silicon 103. The silicon can be, for example, P+ doped (0.01 Ω-cm, about $3\times10^{18}$ cm$^{-3}$). A nanotube 104 can be deposited on the thermal oxide 102 and a photoresist 105 can be positioned by photolithography. The nanotube can be deposited in the foam of a slurry, where nanotube deposition is random. The nanotube can be deposited by directed assembly, as described below. The photoresist exposes the ends of the nanotube. Metal contacts 106-107 are formed in the trenches that expose the nanotube ends. The metal can be, for example, Cobalt (Co), Nickel (Ni), Tungsten (w), or Titanium (Ti). The metal can be deposited over the device, filling the trenches exposing the ends of the nanotube 104. The photoresist 105 can be stripped. The metal deposited in the trenches form source/drain contacts 106-107. An amorphous Silicon (a-Si) 108 can be deposited over the device. A Nitride layer 109 can be deposited over the a-Si layer. The Nitride can be etched to form spacers, e.g., 110 on the sides of the metal contacts 106-107. The amorphous silicon 108 can be selectively removed or wet chemically oxidized. A gate dielectric film 111 can be deposited over the device. Here as in the following methods, the dielectric can be silicon dioxide as well as any other high-k dielectric material, for example, HfO$_2$. A gate 112 can be formed substantially between the metal contacts 106-107 forming the source and drain, for example by CVD and etching. A passivation dielectric layer 113 is deposited over the device. The source, drain and gate 112 are self-aligned to the alignment mark 101.

Figure 2A:
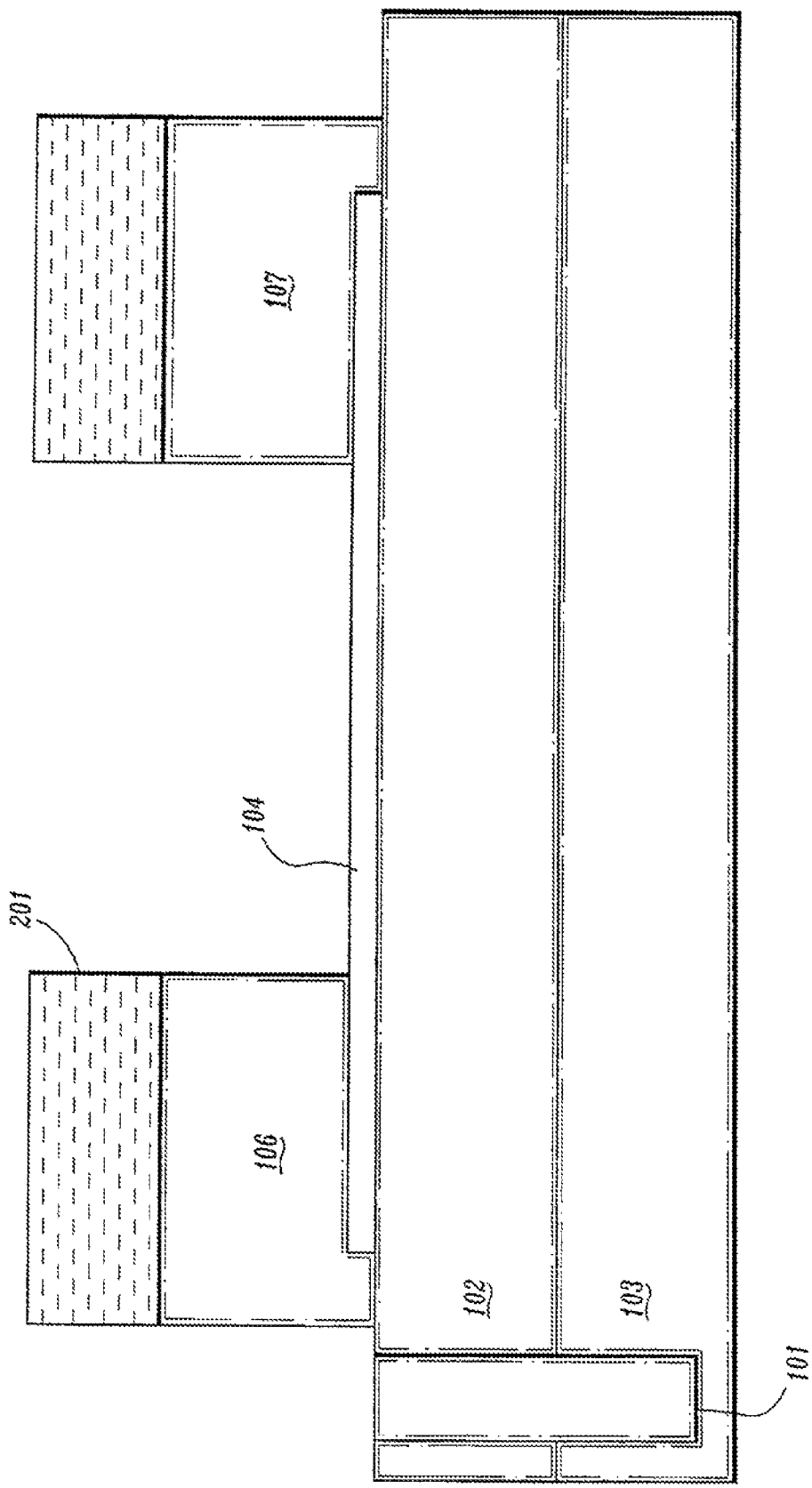
FIGS. 2a-b illustrate another source/drain first carbon-nanotube field effect transistor according to an embodiment of the present invention.
Figure 2B:
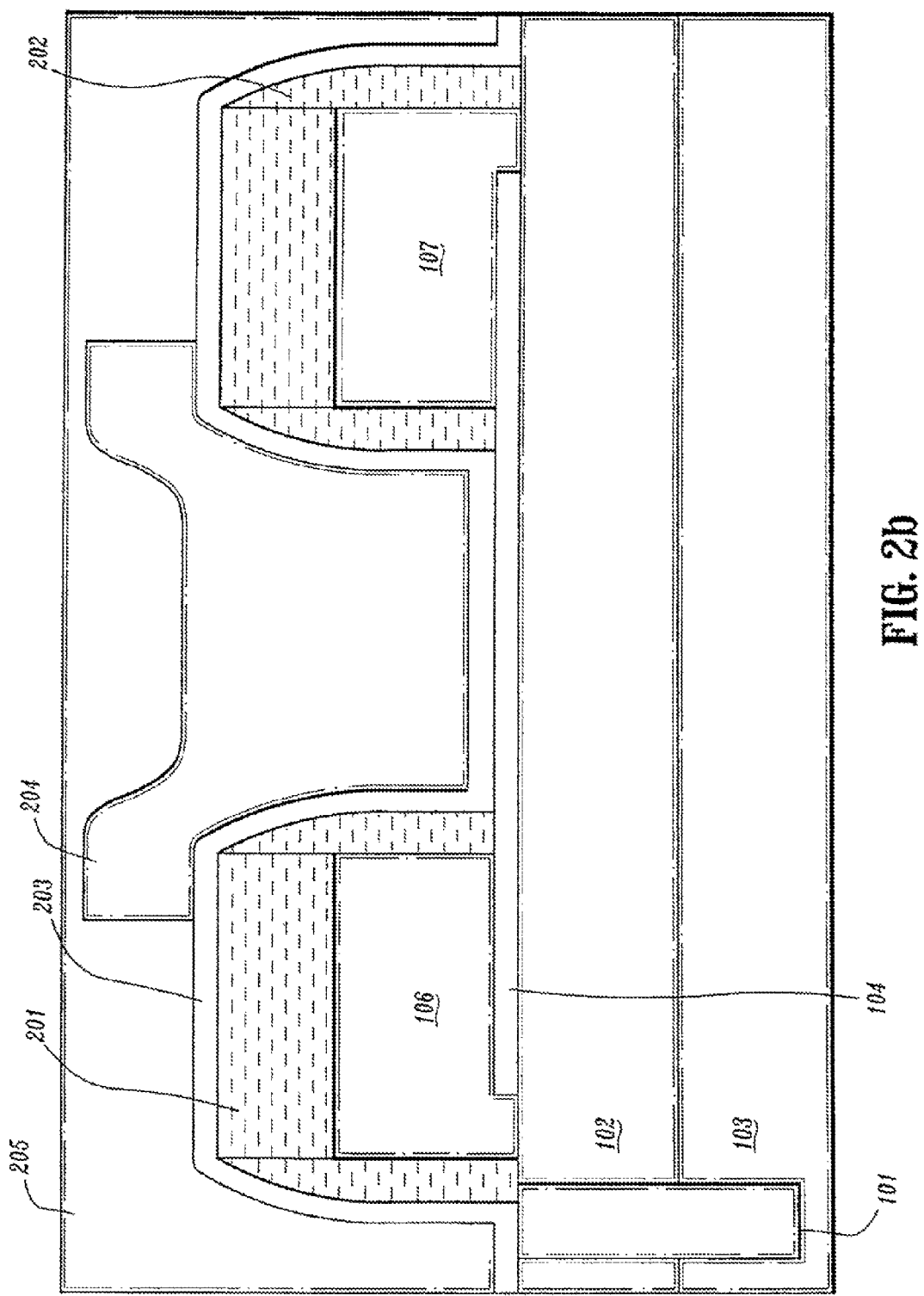
Figure 3A:
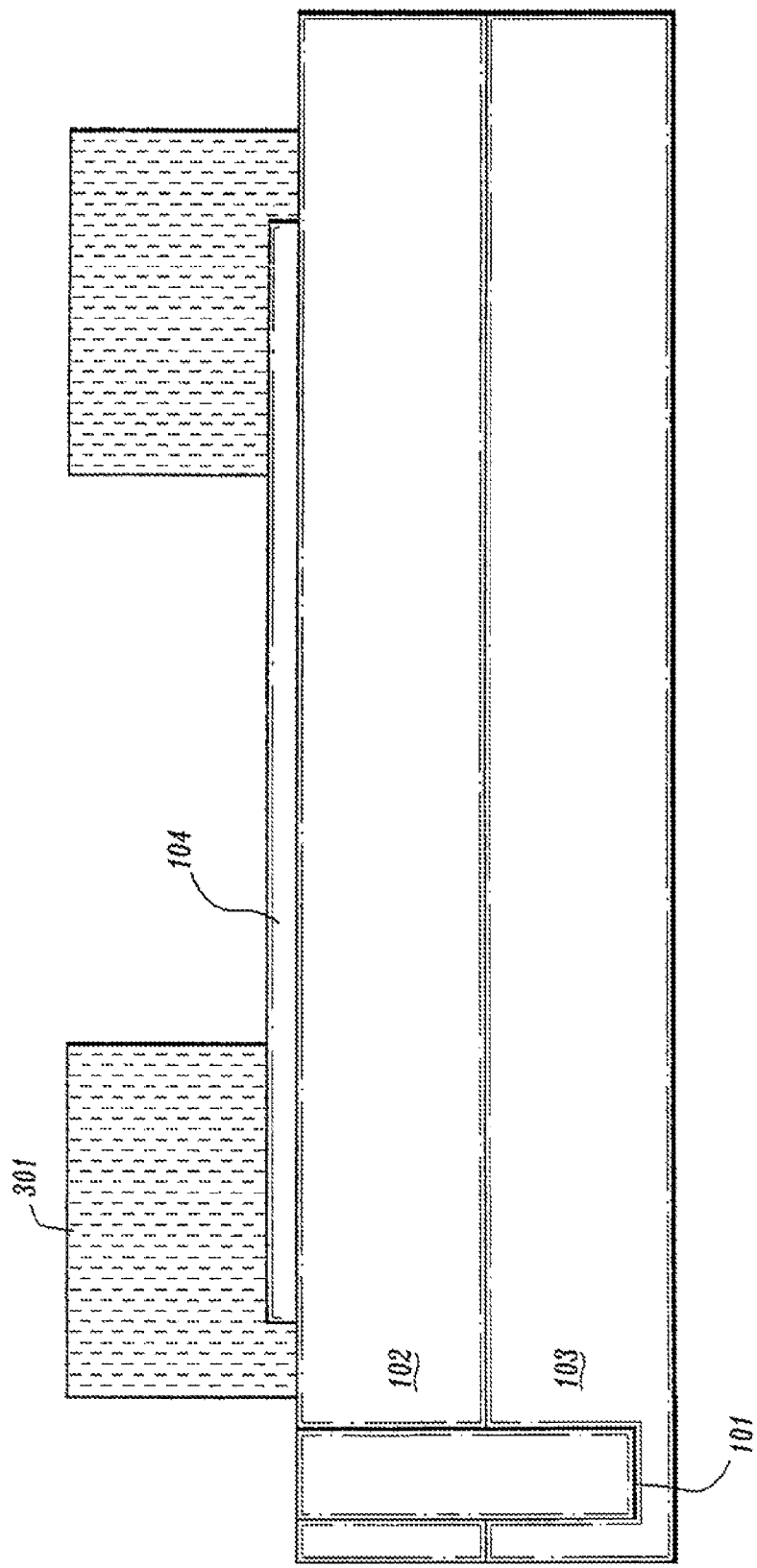
Figure 3B:
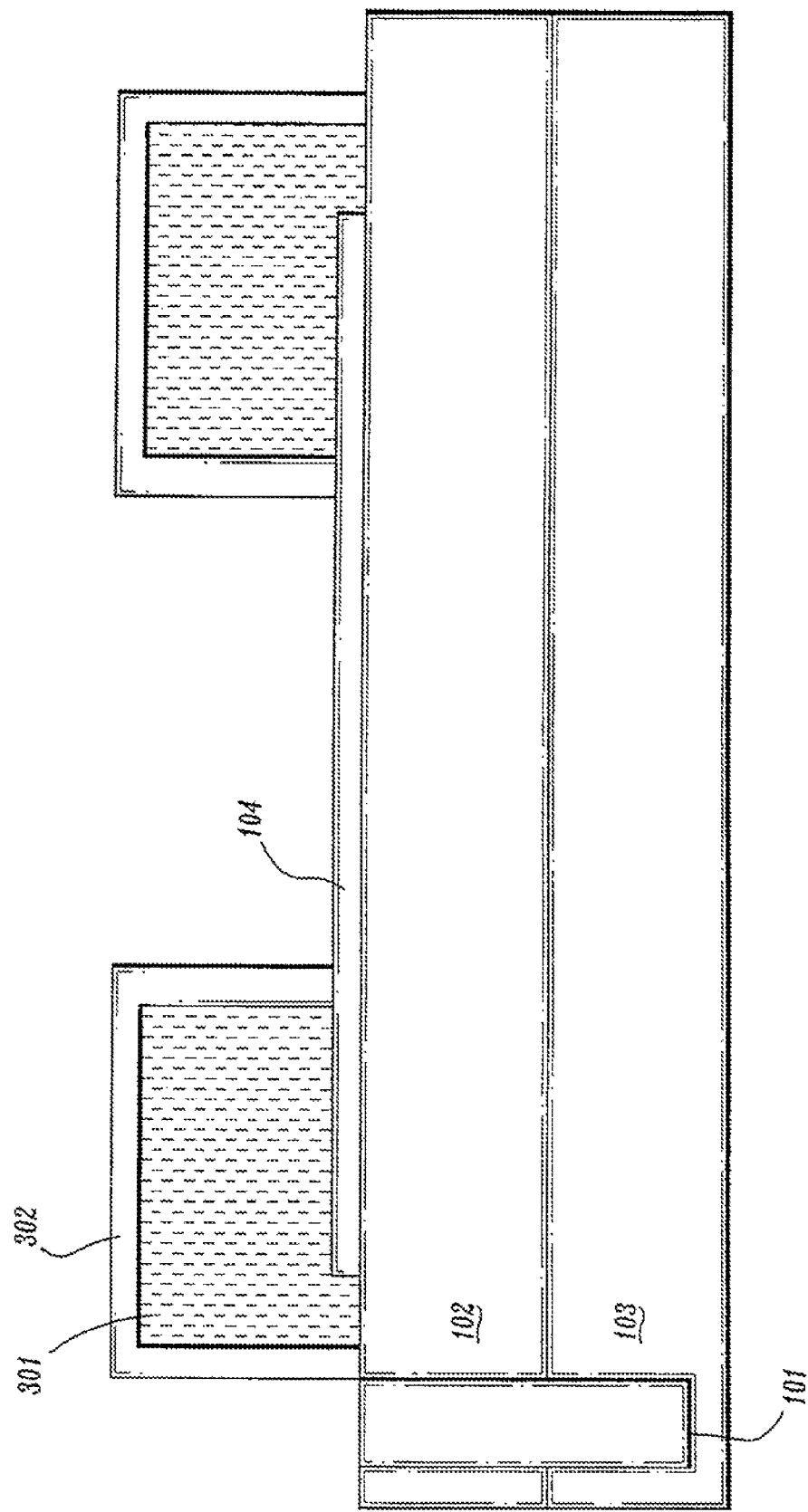
Figure 3D:
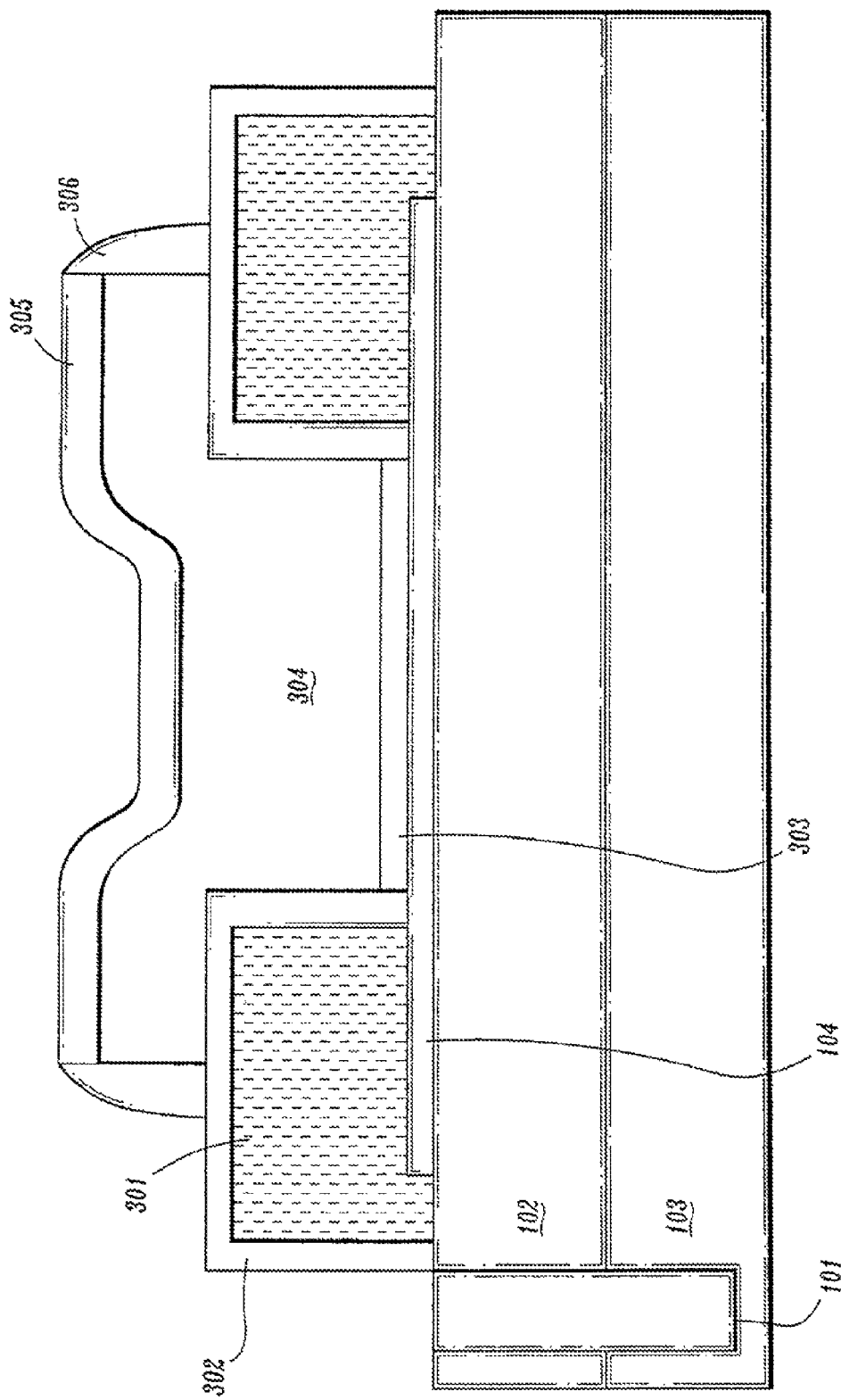
Figure 3E:
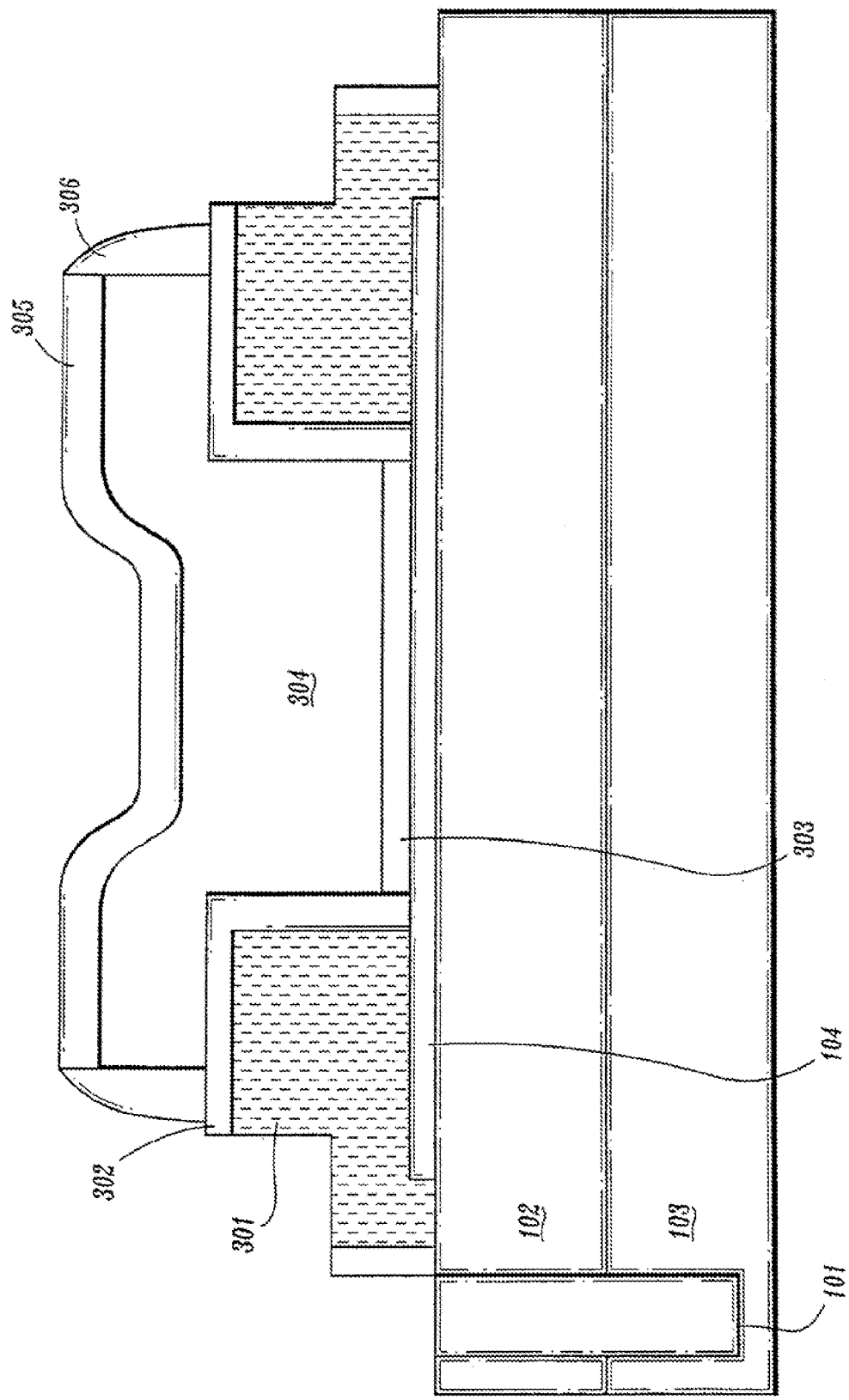
Figure 3F:
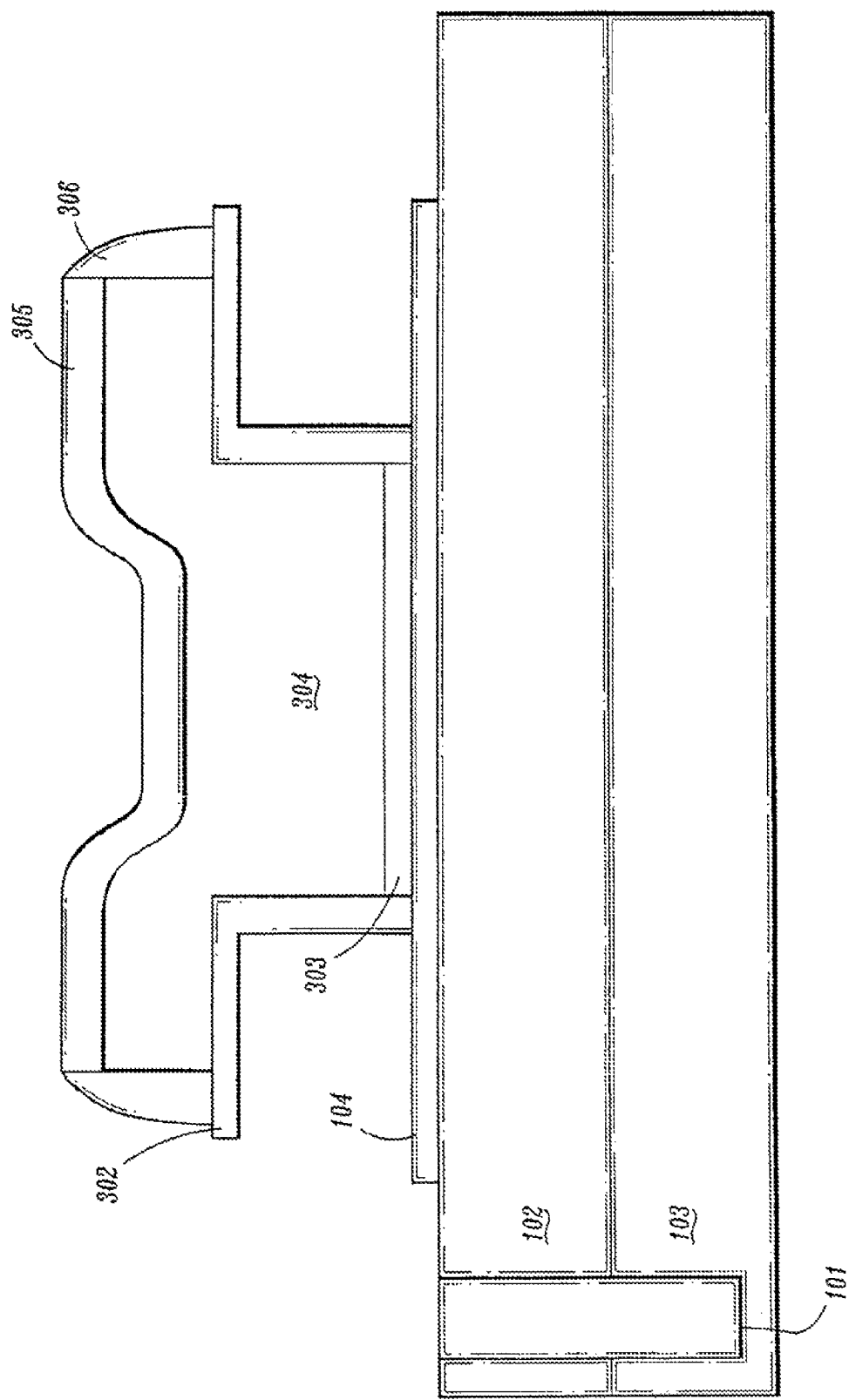
Figure 3G:
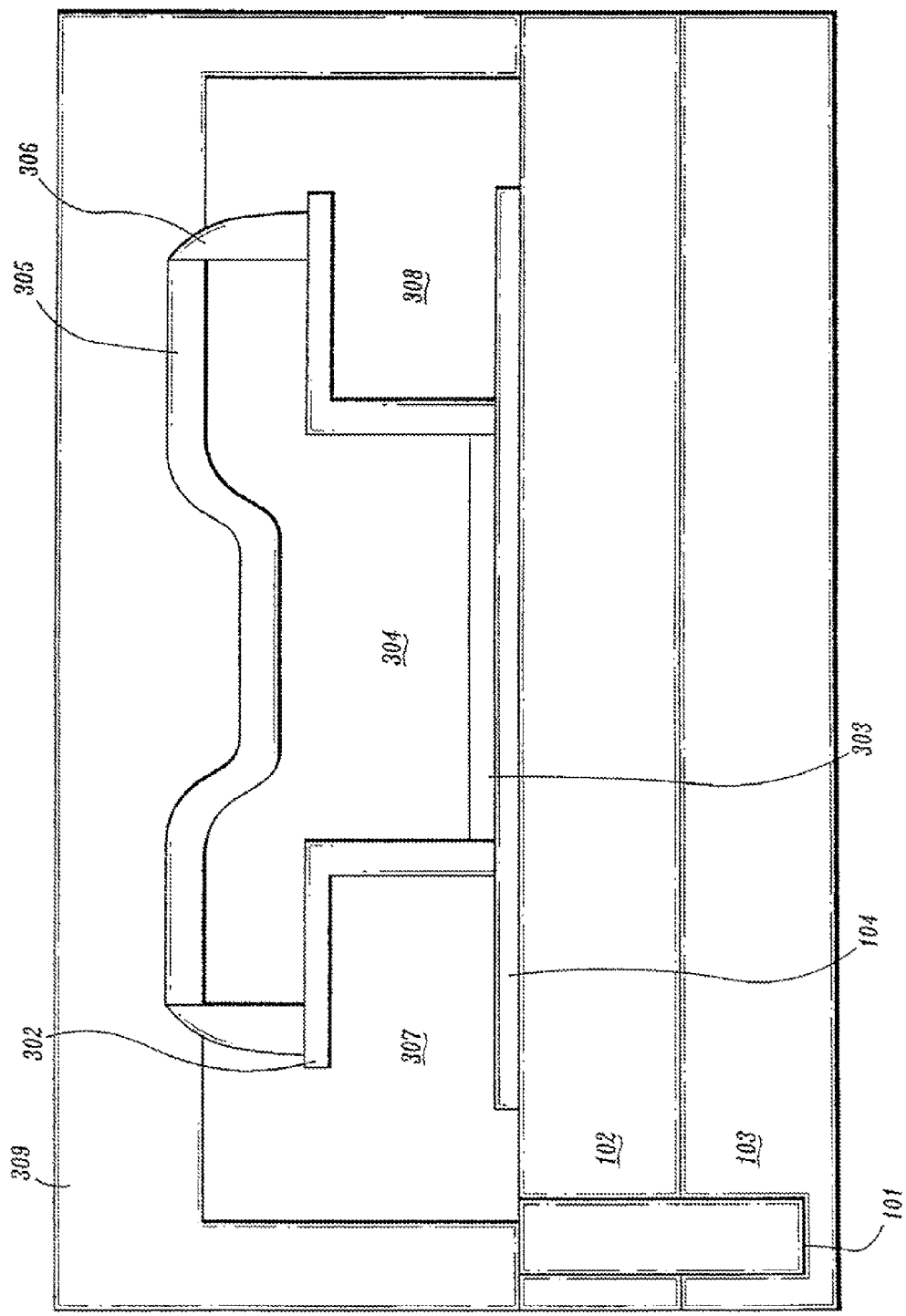
Figure 4A:
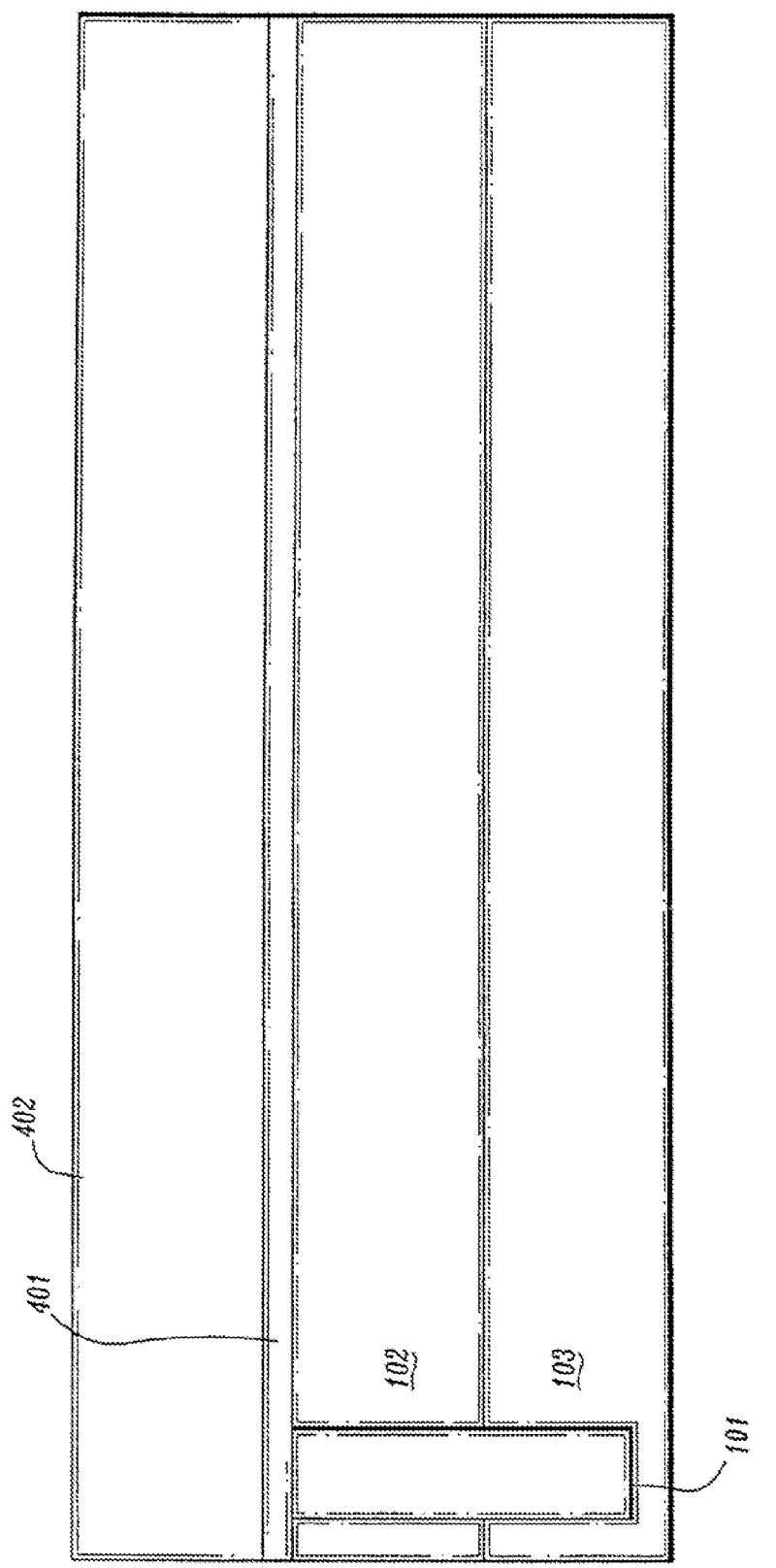
FIGS. 4a-d illustrate a carbon-nanotube field effect transistor comprising a nanotube grown in place according to an embodiment of the present invention.
Figure 4B:
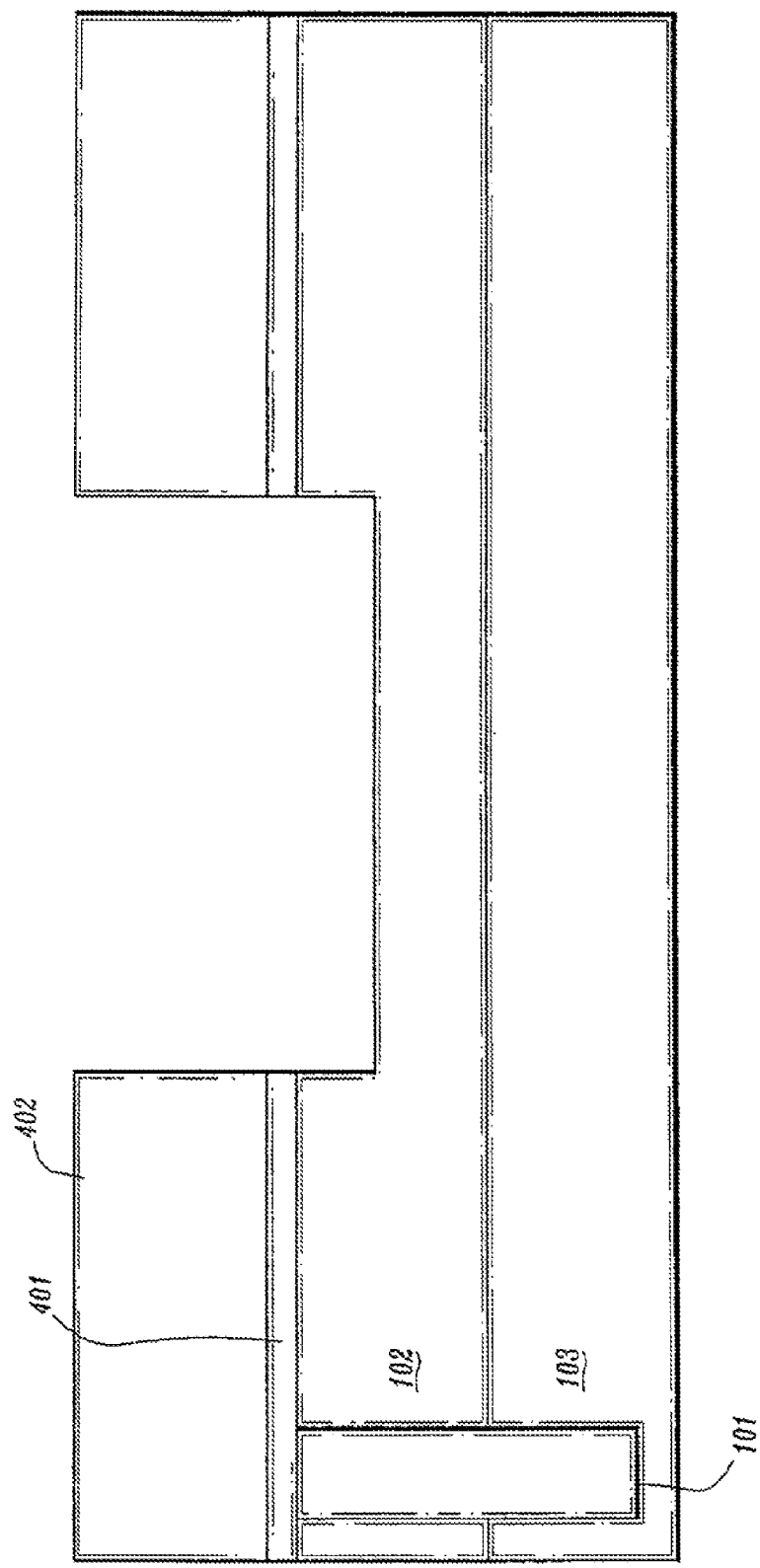
Figure 4C:
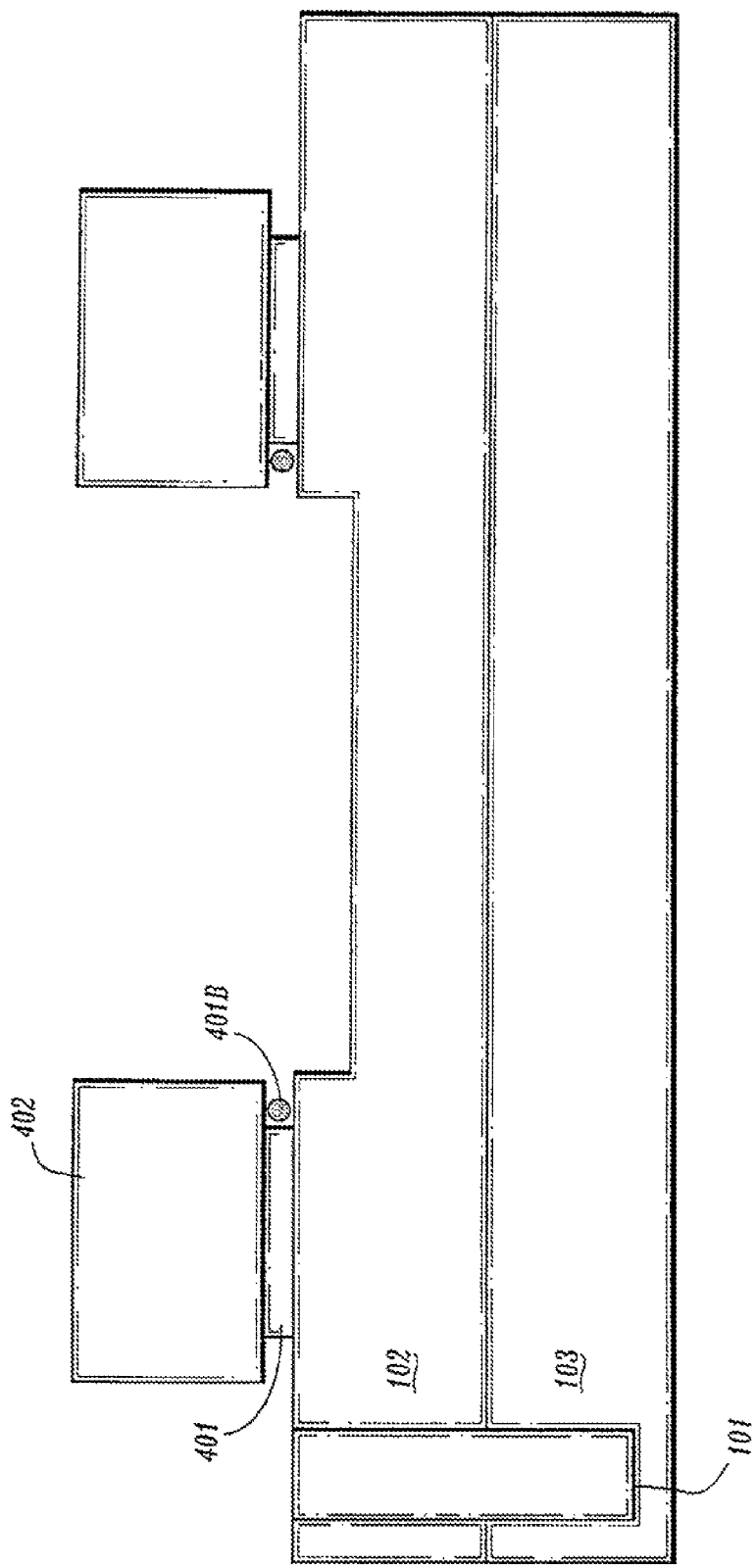
Figure 4D:
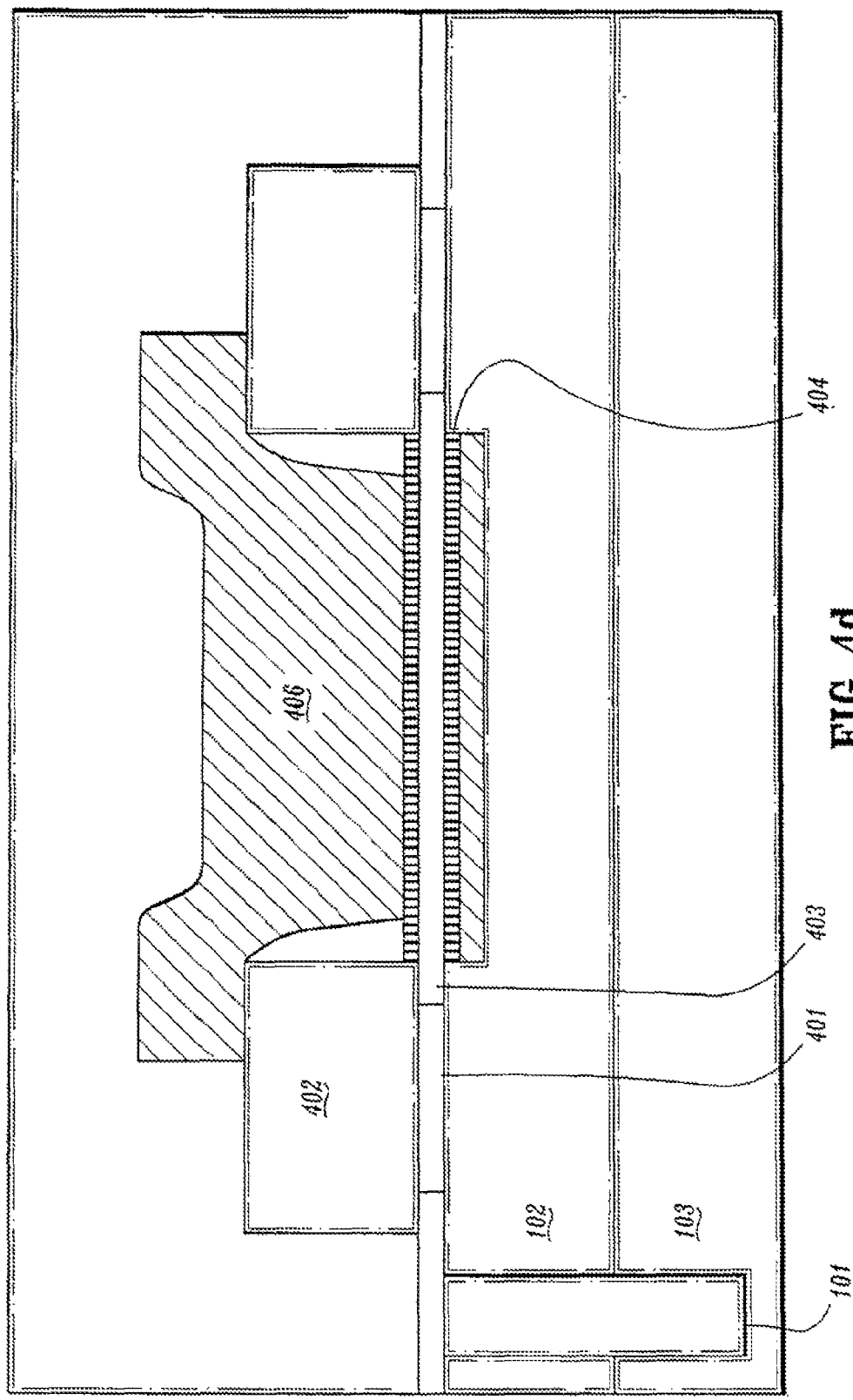

Alternatively, the source/drain can be formed before the gate with a reactive ion etch (RIE). Referring to FIGS. 2a-b, a method forms the source/drain, 106-107, first using RIE to define the source/drain metal. The RIE needs to be isolated from the carbon-nanotube 104. A nitride layer 201 can be deposited over the device and etched from the areas surrounding the metal contact. Nitride spacers, e.g., 202, can be formed on the sides of the metal contacts. A gate dielectric 203 is deposited over the device. The gate metal 204 is formed substantially between the source and the drain, 106-107. A passivation dielectric 205 can be deposited over the device. The thermal oxide can be approximately 150 nm thick.

According to another embodiment of the present invention, the gate can be formed before the source/drain. Amorphous silicon 301 can be deposited over the ends of the nanotube 104. The a-Si can be covered with an oxide layer 302. A gate dielectric 303 can be deposited between the a-Si, e.g., 301. A gate 304 can be formed substantially between the a-Si pillars, e.g., 301. A nitride layer 305 can be formed over the gate metal 304. Oxide spacers, e.g., 306 can be formed on the ends of the gate metal 304. The exposed corners of the a-Si/oxide can be stripped, exposing the a-Si. The remaining a-Si surrounding the gate metal can be removed by RIE. Metal contacts 307-308 can be deposited in the area previously occupied by the a-Si. The metal contacts 307-308 are connected to the nanotube 104 that runs beneath the gate dielectric 303 and gate metal 304. The metal contacts 307-308 form the source and the drain of the device. The metal contacts 307-308 can be aligned to the alignment mark 101 deposited in the thermal oxide 102 and silicon 103 substrate. A passivation dielectric 309 can be deposited over the device.

According to an embodiment of the present invention, a carbon-nanotube FET can be grown in place. The source/drain can be formed before the gate. An amorphous silicon layer 401 is deposited over the thermal oxide layer 102. A low temperature oxide (LTO) layer 402 can be deposited over the metal catalyst. A trench can be etched from the oxide 402, amorphous silicon 401 and thermal oxide 102. The amorphous silicon 401 can be partially under cut from below the oxide 402. A metal catalyst 401B, for example, Fe, Co, Ni or Fe/Mo can be self-assembled on the edges of the undercut amorphous silicon film 401. The carbon-nanotube 403 can be grown between the remaining portions of the metal catalyst 401B, wherein a portion of the nanotube is suspended over the thermal oxide 102. A gate dielectric film 404 can be deposited by chemical vapor deposition (CVD), wrapping the nanotube 403. Thus, the nanotube 403 can be completely covered with the gate dielectric, e.g., $SiO_2$. Spacers, e.g., 405, can be formed on the sides of the oxide, e.g., 402. A gate 406 can be formed substantially between the oxide, e.g., 402. If the etch in the thermal oxide 102 is sufficiently deep, the gate metal 406 can surround the whole nanotube 403 and the dielectric film 404 stack. For this purpose the gate metal can be deposited by means of chemical vapor deposition to cover the back side of the nanotube/dielectric film stack. The wrapped around configuration offers a good gate-to-nanotube coupling. A passivation dielectric 406 can be deposited over the surface of the device.

Figure 5A:
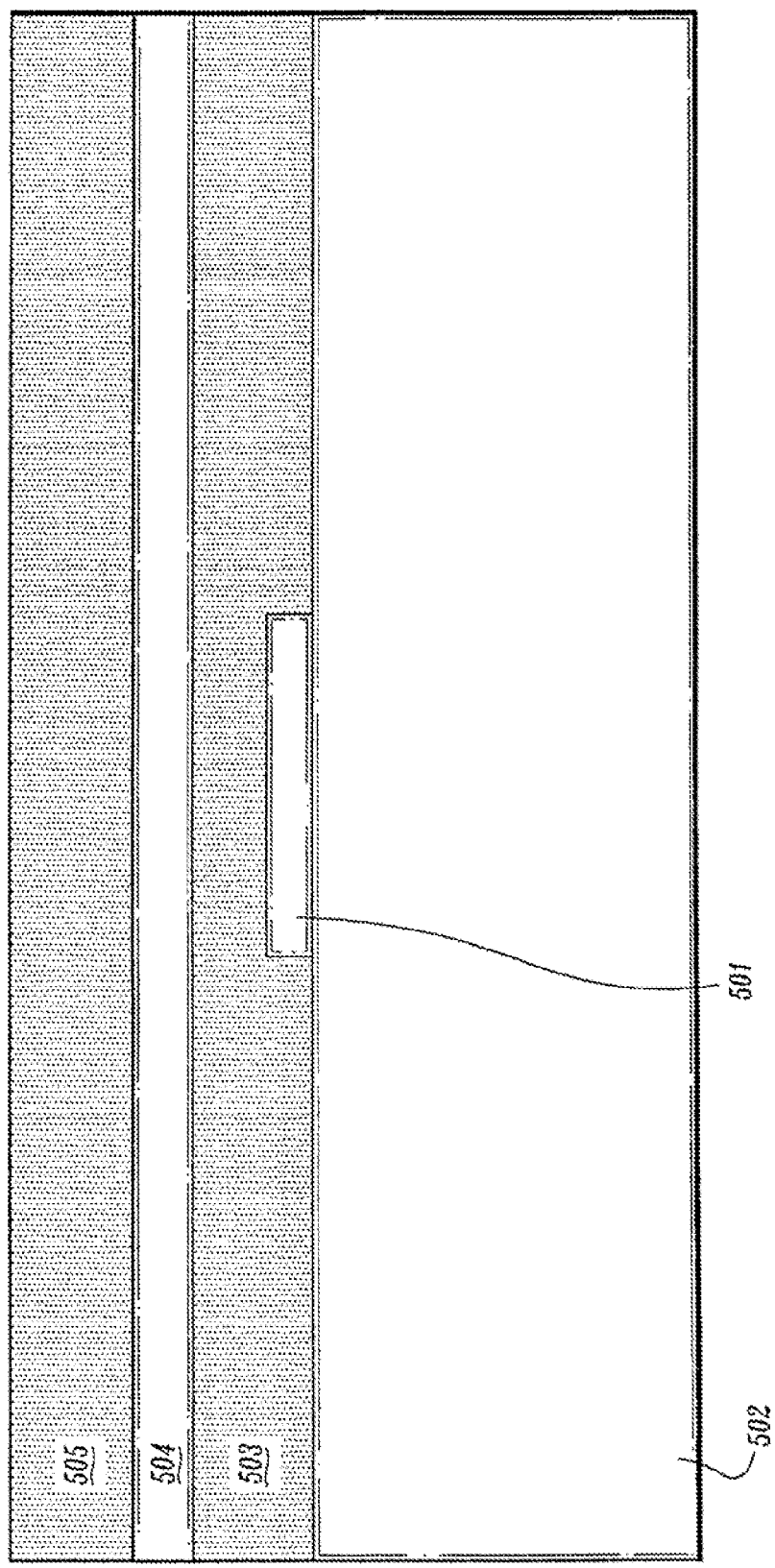
FIGS. 5a-n illustrate a carbon-nanotube field effect transistor comprising a nanotube grown in place vertically according to an embodiment of the present invention.
Figure 5B:
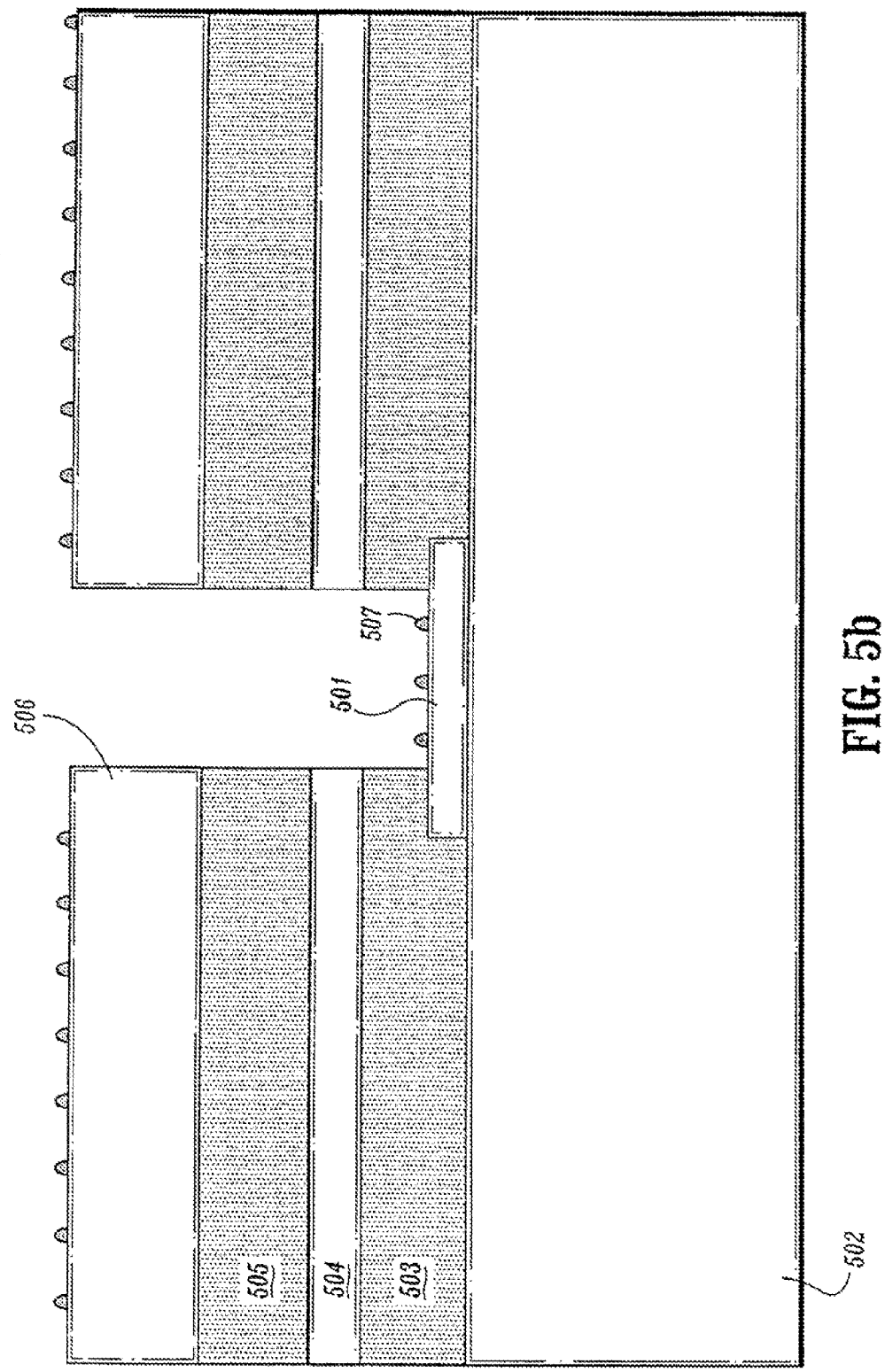
Figure 5C:
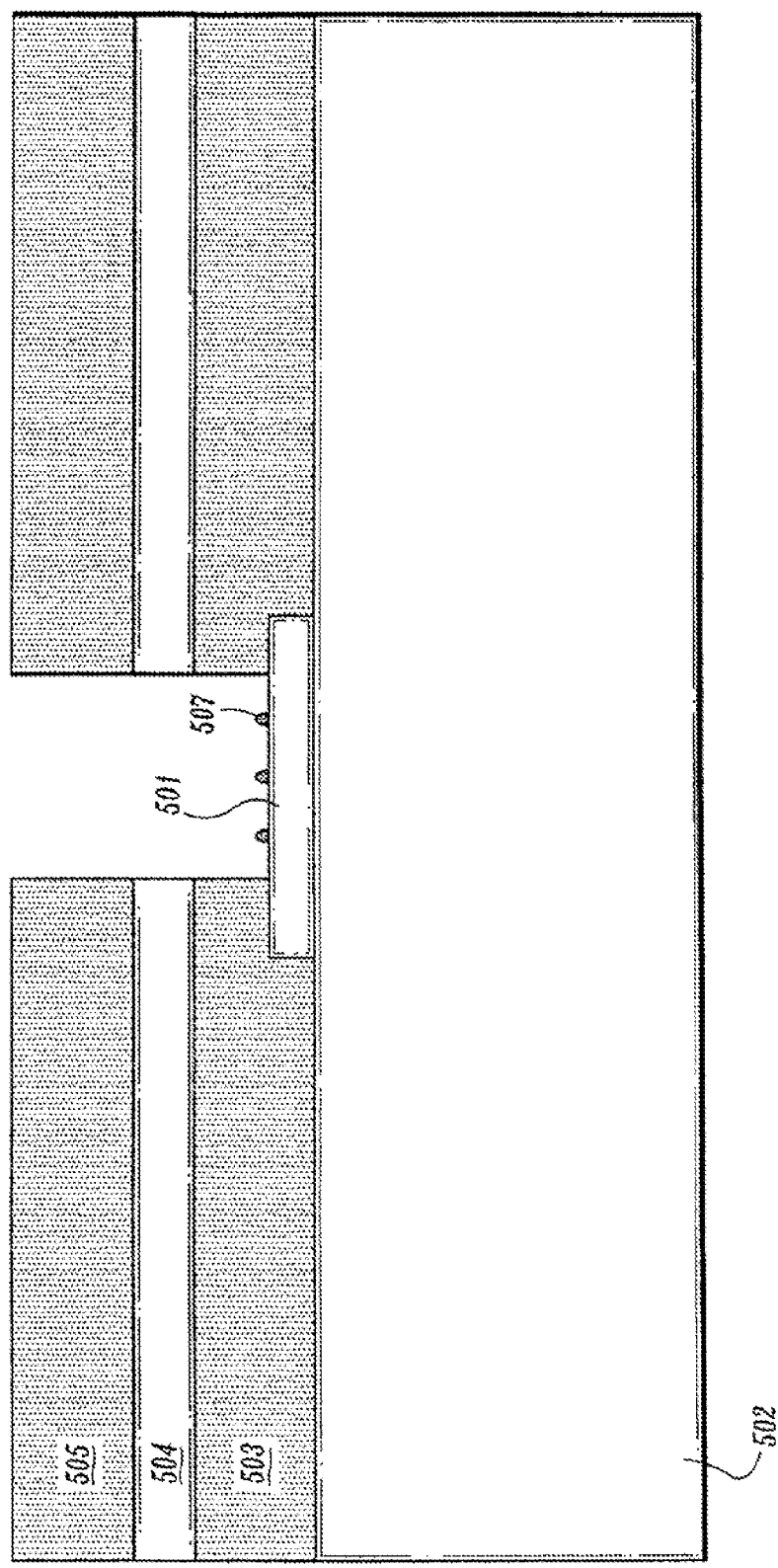
Figure 5D:
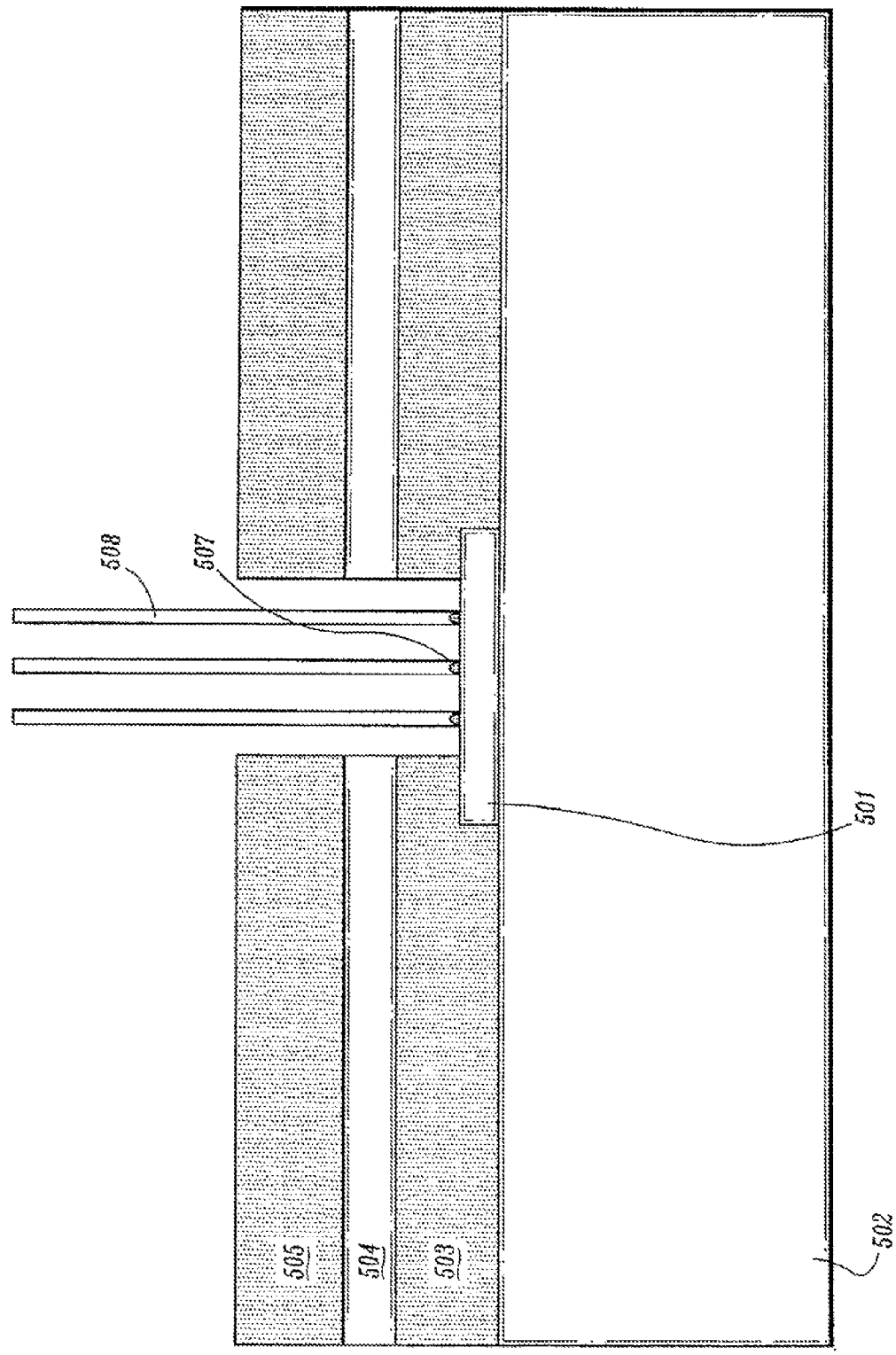
Figure 5E:
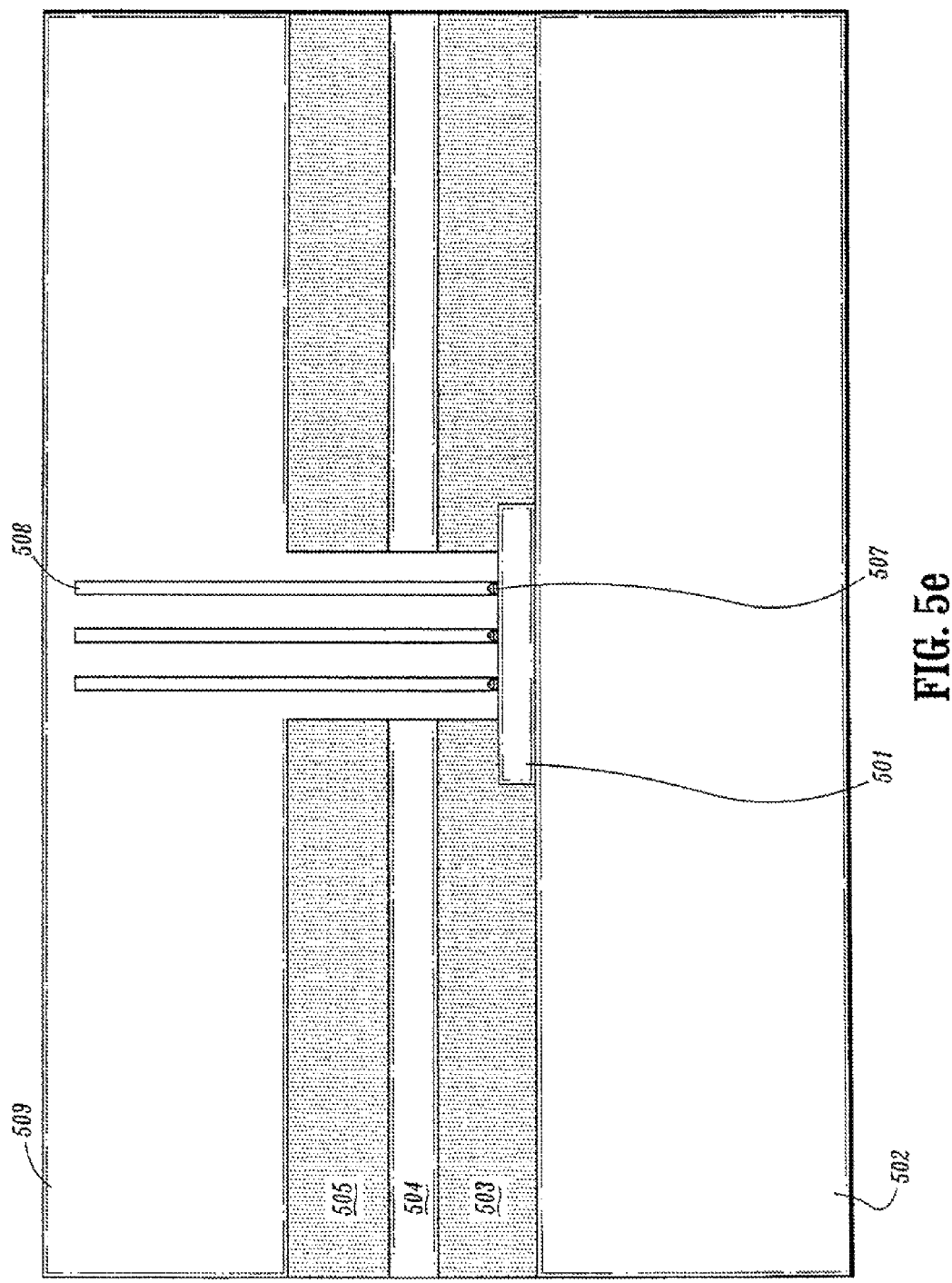
Figure 5F:
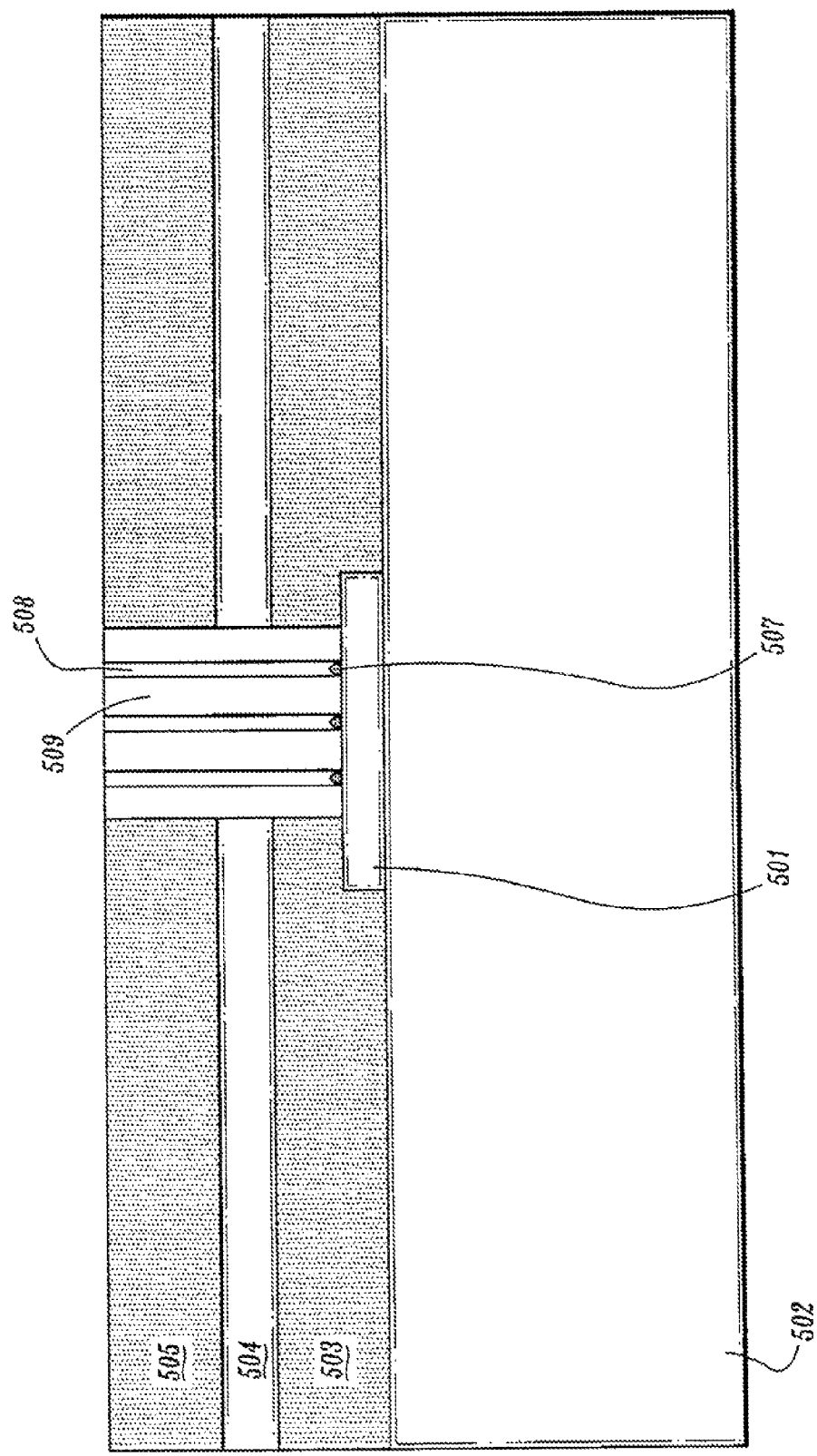
Figure 5G:
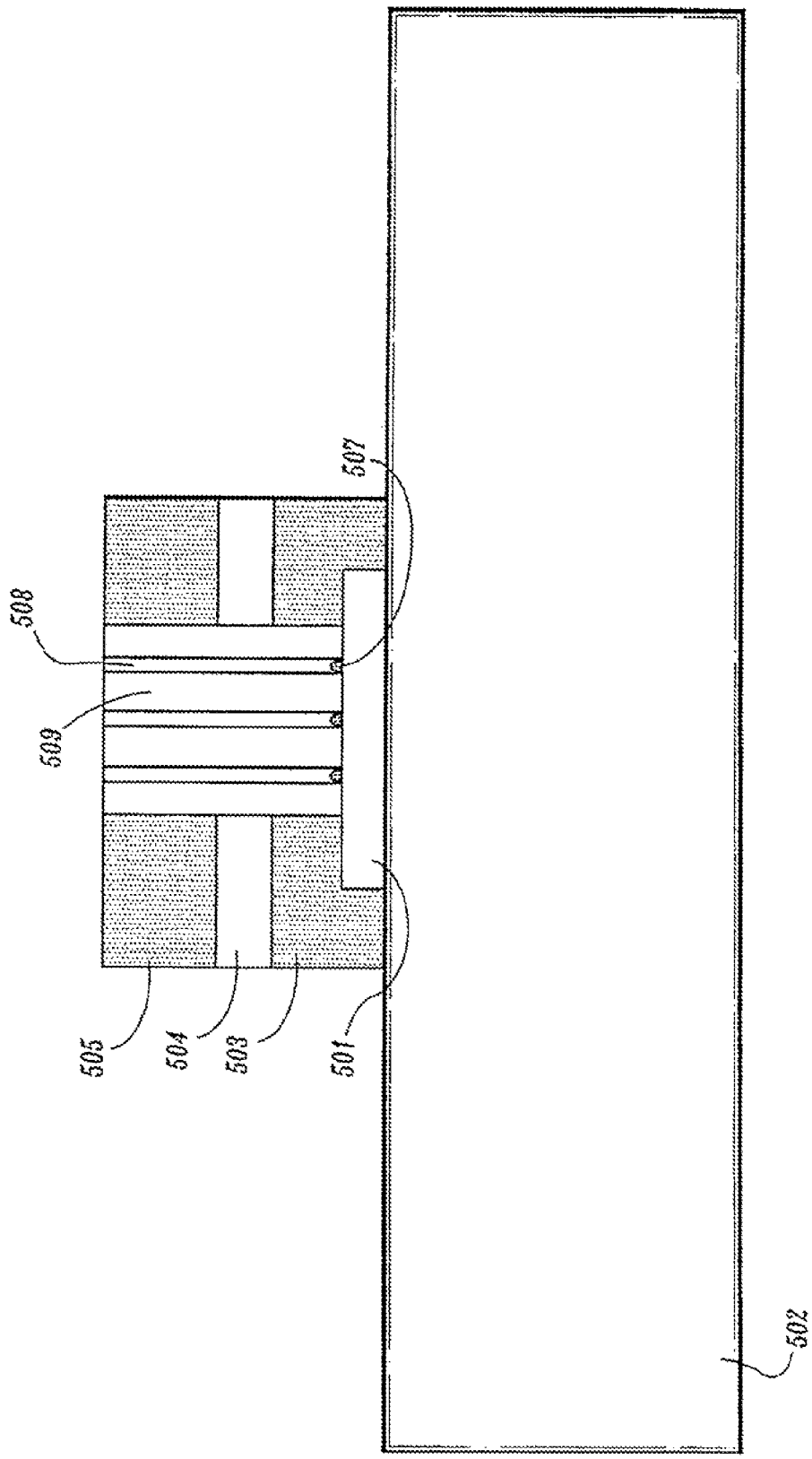
Figure 5H:
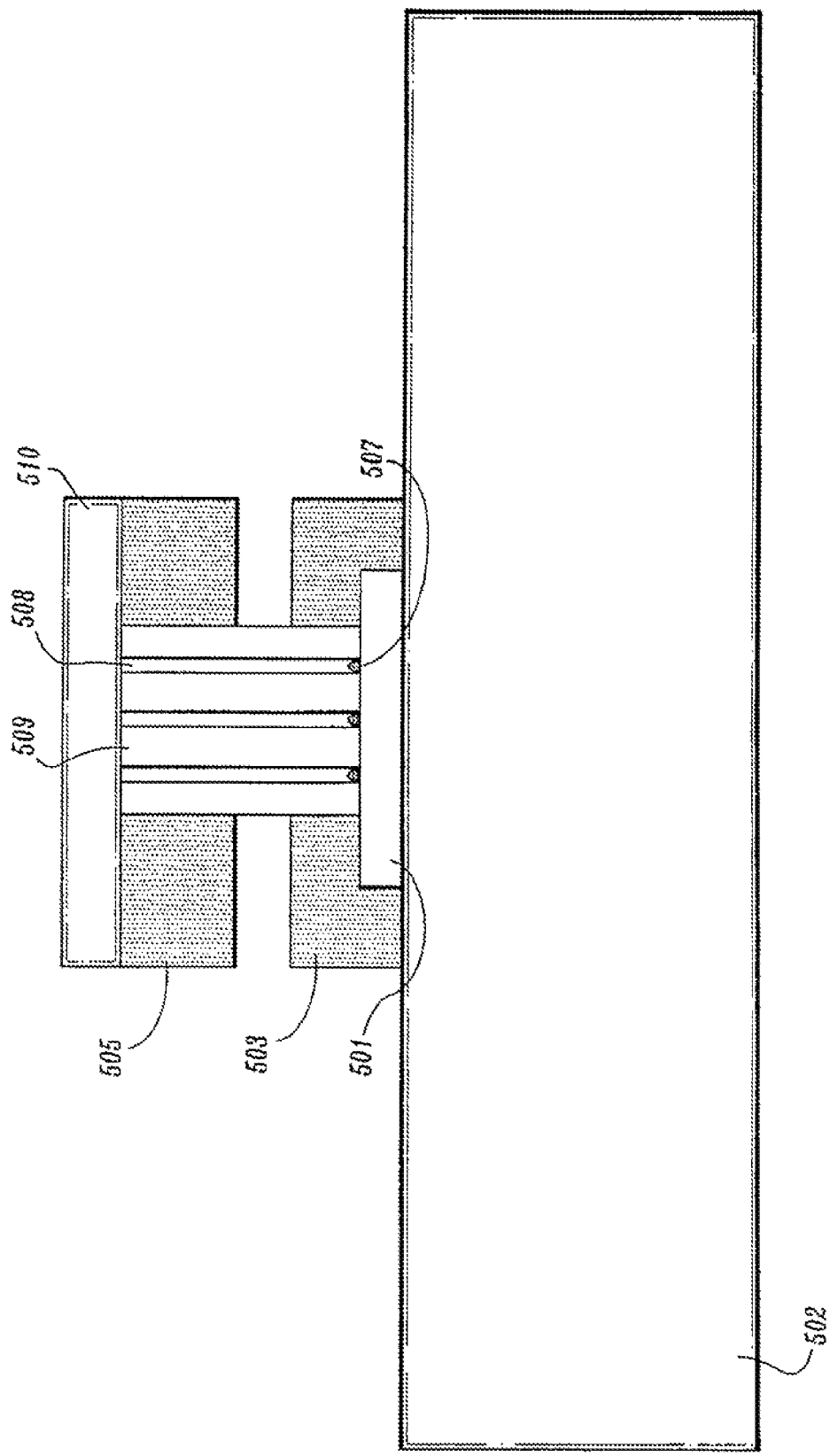
Figure 5I:
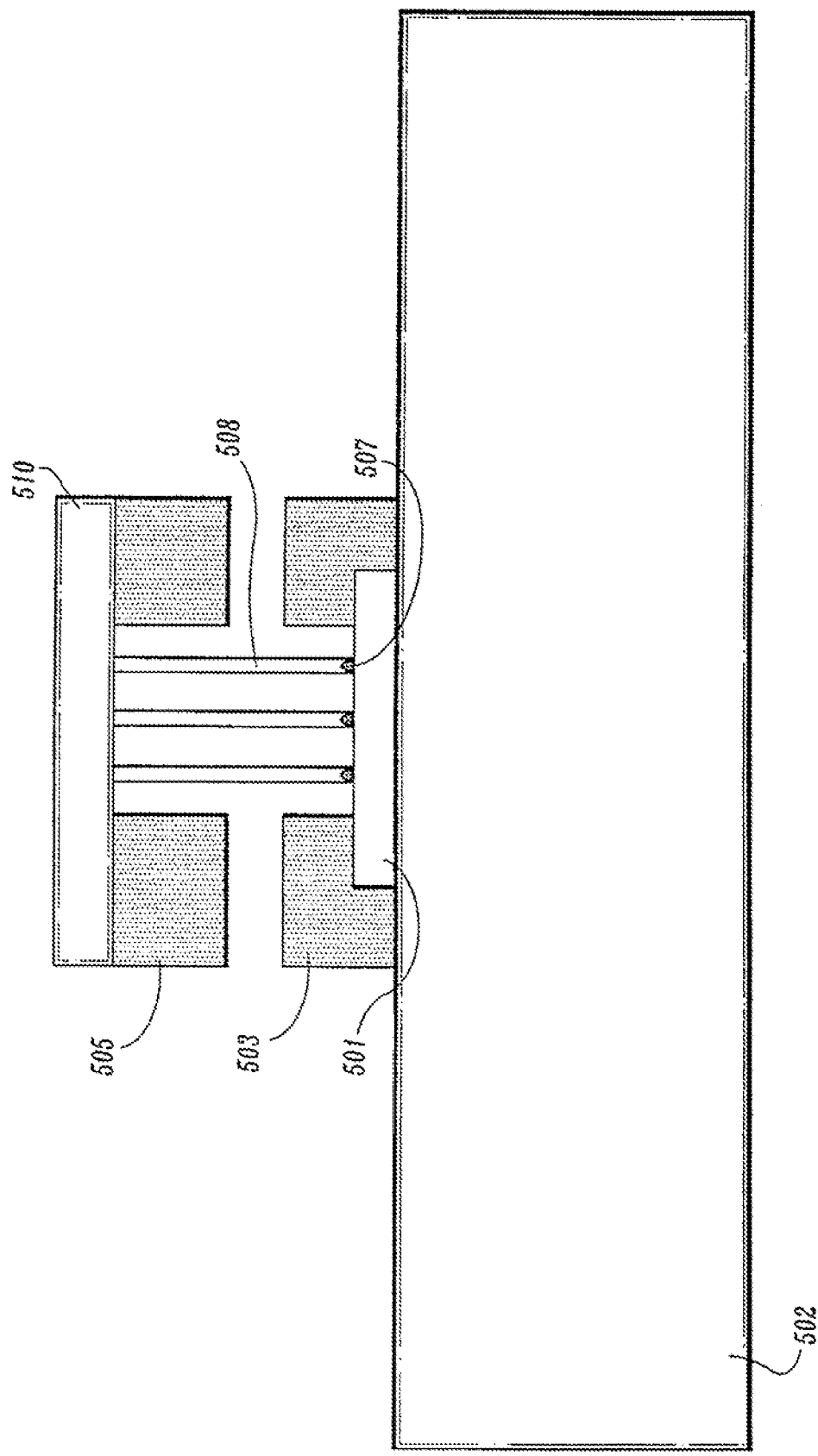
Figure 5J:
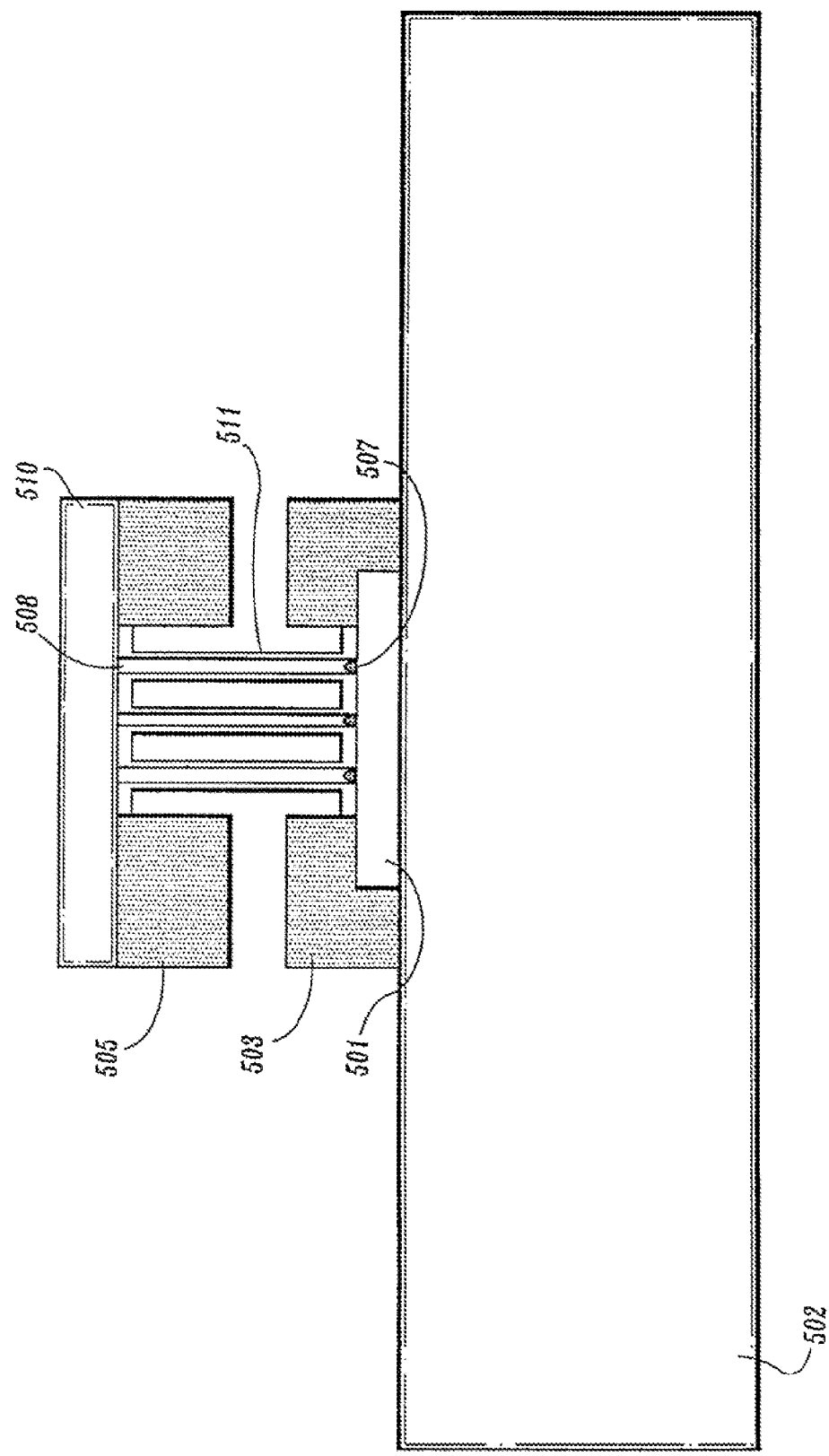
Figure 5K:
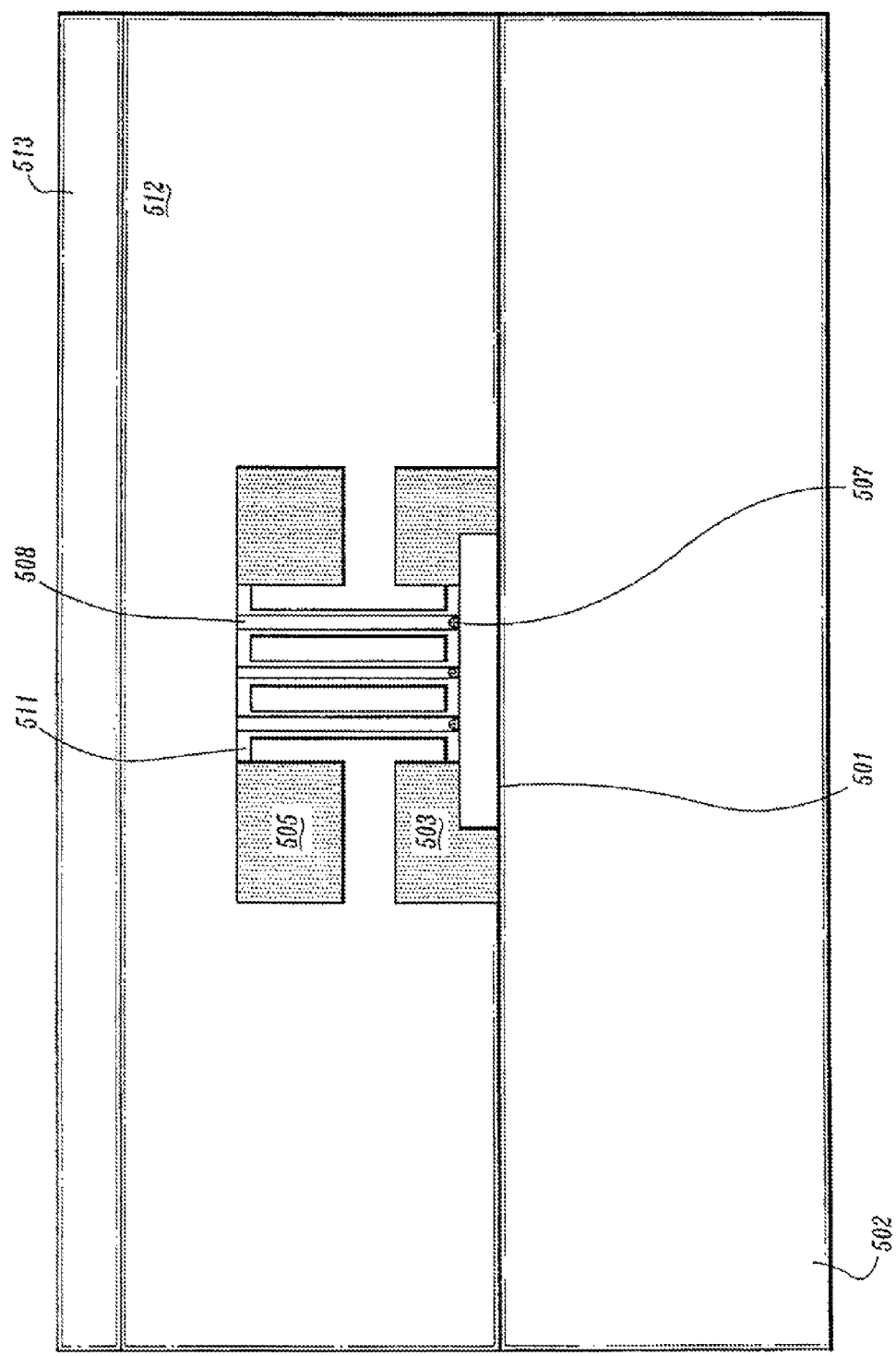
Figure 51:
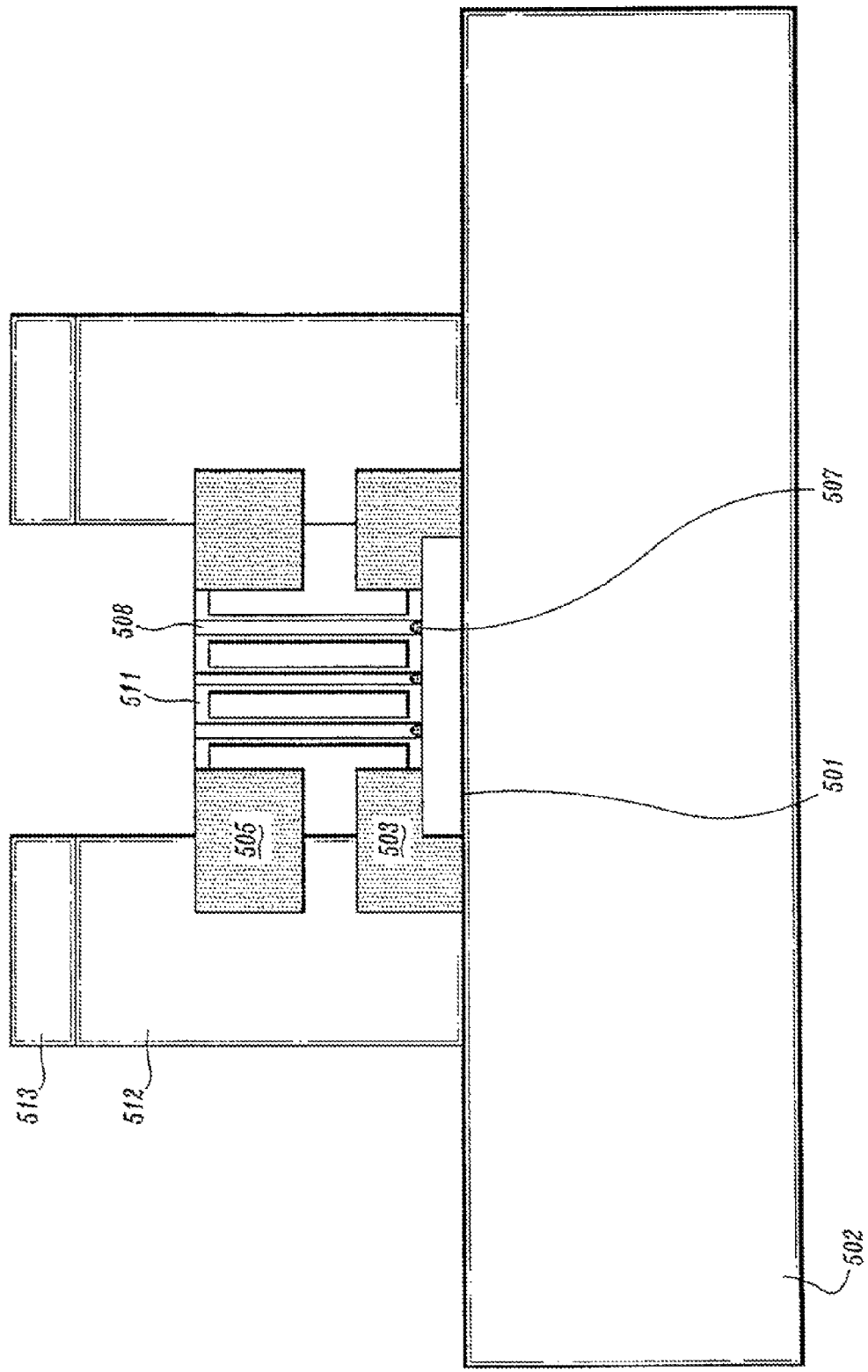
Figure 5N:
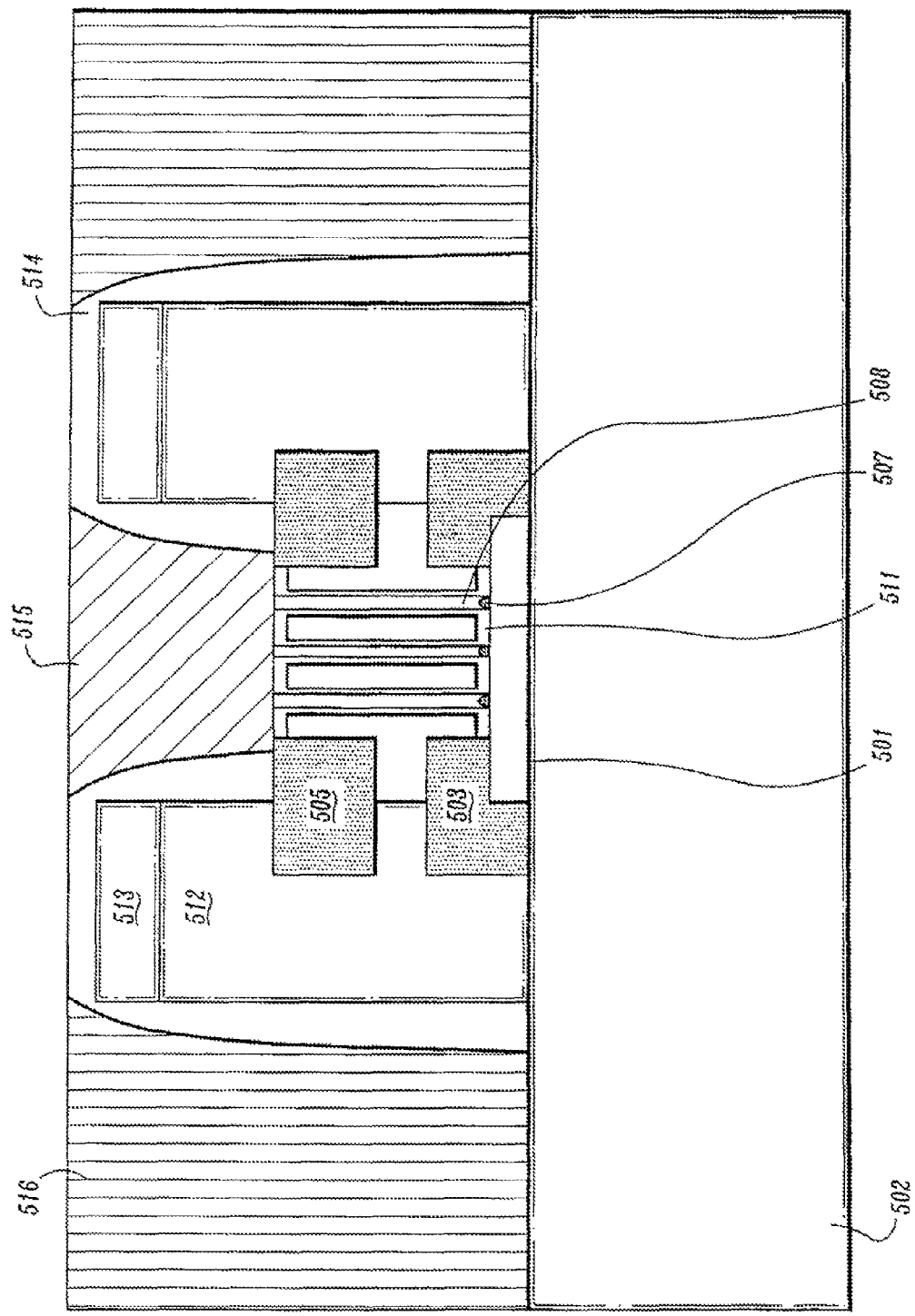

According to another embodiment of the present invention, a carbon-nanotube can be grown in place vertically. The nanotube can be grown vertically from, for example, a metal source at the base or a metal particle catalyst. Referring to FIG. 5a-n, a metal catalyst 501 can be formed on the silicon substrate 502. A first layer of Nitride 503 can be deposited over the device. An oxide layer 504 can be deposited over the first layer of Nitride 503. A second layer of Nitride 505 can be deposited over the oxide 504. A photoresist, e.g., 506, can be formed on the device by photolithography, wherein the metal catalyst 501 is exposed. A plurality of second metal catalysts, e.g., 507, are deposited over the device. The photoresist, e.g., 506, can stripped, such that the second catalyst, e.g., 507, formed on the first metal catalyst 501 remain. From each second metal catalyst, e.g., 507, a nanotube, e.g., 508, can be grown vertically. Thus, two-dimensional and three-dimensional arrays of nanotubes can be formed.

Vertical growth of the nanotubes occurs when the metal particle catalyst is placed in a pore aligned vertically to the substrate. In this case, the space for the growth is confined and forces the growth of the tube to follow the vertical direction. In principle, vertical pores such as in FIG. 5b can be made using the resists and pattern transfer.

An amorphous Silicon layer 509 can be deposited over the device. The device can be planarized down to the second Nitride layer 505. A portion of the Nitride-Oxide-Nitride layering, 503-505, can be removed from the device. A pillar surrounding the nanotubes, e.g., 508, and metal catalyst, 501 and 507, remains. A sacrificial layer 510 can be formed over the Nitride layer 505 the nanotubes 508 and the a-Si 509. The contact layer can be, for example, titanium or tungsten. The oxide layer 504 can be removed from between the layers of Nitride, 503 and 505. The a-Si 509 can be etched simultaneously with the oxide layer 504 from around the nanotubes, e.g., 508. Alternatively, the a-So 509 can be removed after the oxide layer 504 has been removed. A gate dielectric, e.g., 511, can be formed around the nanotubes, e.g., 508, over the metal catalyst 501 and under the sacrificial layer 510. Alternatively, for a two-dimensional array of nanotubes, the gate dielectric 511 can be deposited between the nanotubes. The sacrificial layer 510 can be removed, for example, by an etch. The gate metal 512 can be deposited over the surface of the device. A third Nitride layer 513 can be deposited over the gate metal 512. Portions of the gate metal 512 and the third nitride layer 513 can be removed. Pillars of gate metal and nitride spacers, e.g., 512 and 513, remain around the metal catalyst-nanotube structure. Nitride spacers, e.g., 514, are formed around each pillar. A drain 515 can be formed over the metal catalyst-nanotube structure, forming a FET. The passivation dielectric 516 can be deposited between FETs.

It should be noted that the exact mechanics of nanotube growth from a metal catalyst are not known. However, the process of growing a single-walled nanotube from a metal catalyst, for example, Cobalt (CO) over alumina-supported Molybdenum (Mo) particles, can be implemented in a number of ways.

Figure 6A:
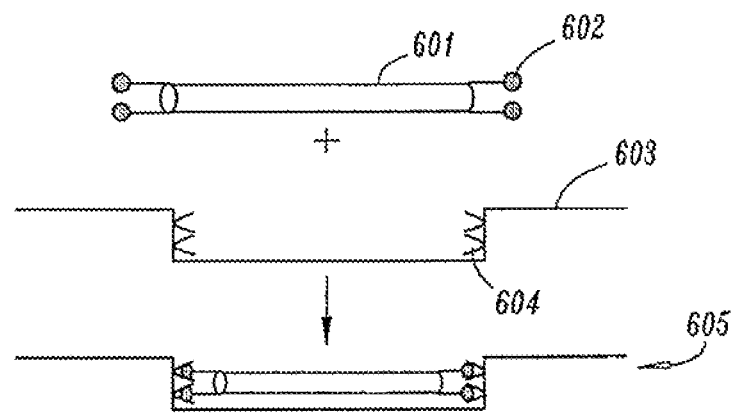
FIGS. 6a-b illustrate directed assembly of nanotubes according to an embodiment of the present invention.
Figure 6B:
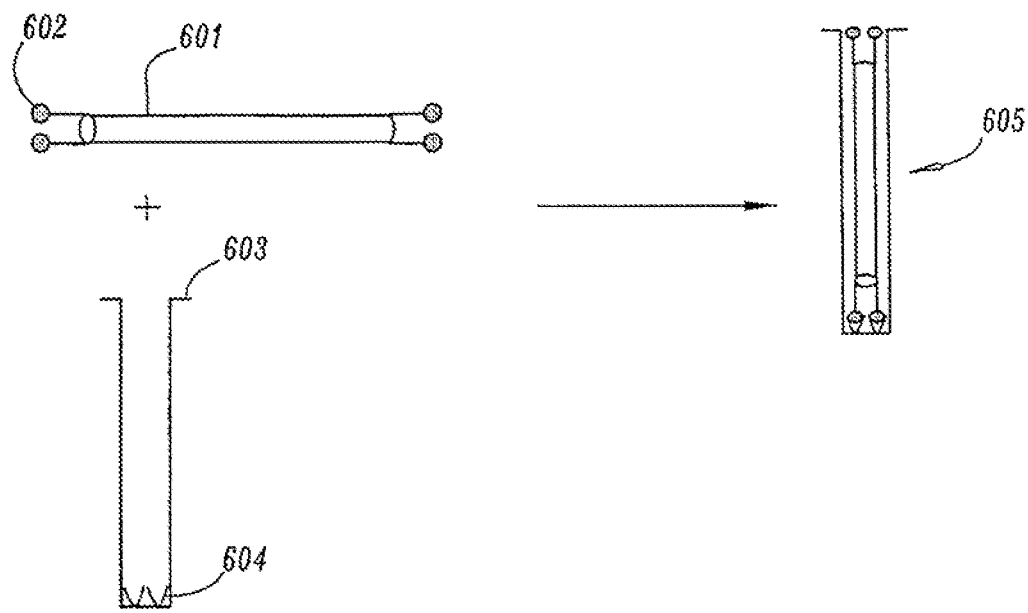

According to an embodiment of the present invention, nanotubes can be put in place by a method of directed assembly rather than deposited or grown as described above. Directed assembly can be used for horizontal and vertical deposition of a nanotube using selective deposition driven by a chemical or a physical process. The selective deposition can include forming an adhesion layer or chemical groups acting as receptors to favor a desired deposition of tubes in a given position. FIGS. 6a and 6b show methods for horizontal and vertical directed assembly, respectively. A nanotube 601 can be prepared comprising predetermined chemical groups 602, for example, a DNA strand or a thiol group, at each end. The nanotube 601 can be brought into the proximity of a substrate 603 comprising receptors 604, for example, where DNA is implemented, a complementary DNA strand can be used. Where a thiol group is used, gold particles or a contact shape comprising gold, can be designed to bond with the chemical groups 602 of the nanotube 601. The nanotube 601 can thus be placed on the substrate 603 according to directed assembly.

For improved performance high-K dielectric films, those having a high dielectric constant, can be used as gate insulators. The capacitance of a carbon-nanotube FET does not significantly change as a function of the thickness of the dielectric film, thus, it can be difficult to achieve the desired capacitance, even with thin gate dielectric films. Aluminum oxide $Al_2O_3$ (k=9) as well as Hafnium oxide ($HfO_2$) (k=20) are promising candidates in this context. CVD-aluminum can be oxidized to generate a high-K gate dielectric or CVD-$Al_2O_3$($HfO_2$ can be deposited directly. Compared with $SiO_2$, these materials increase the gate capacitance by a factor of up to five, and can have a larger impact on the device performance than reducing the dielectric film thickness. Since nanotubes are pFETs in an air environment and become nFETs in vacuum and inert gases like Argon (Ar) after annealing, the device can be annealed before the deposition of the dielectric film is added. This converts the tubes into nFETs. Capping them in situ with the dielectric also prevents tubes from becoming pFETs again. For a complementary technology the dielectric film on FETs, which should be turned into pFETs, can be locally removed—also allowing the FETs to be doped. A CVD deposition at low temperature coats these devices again (without an extra annealing step before).

Since all structures (pFETs and nFETs) are covered with oxide (or any other suitable dielectric film) no short is generated when the gate electrode is fabricated. CVD can be used for the deposition of the gate. Using chemical vapor deposition for fabrication schemes as described in FIGS. 4 and 5 can ensure that nanotubes that are already wrapped in a dielectric film become completely surrounded by the metal gate. This can be important for good gate-to-nanotube coupling. The gate metal can be patterned and removed where desired. Source and drain electrodes can be opened for electrical access.

Having described preferred embodiments for carbon-nanotube FETs and methods of making same, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for forming a self-aligned carbon-nanotube field effect transistor semiconductor device comprising the steps of:
    depositing a nanotube on a thermal oxide substrate, wherein the substrate includes an alignment mark;
    forming an amorphous silicon pillar over each end of the nanotube;
    isolating the amorphous silicon pillars with a layer of oxide;
    forming a gate dielectric layer between the amorphous silicon pillars;
    forming a gate substantially between the amorphous silicon pillars and over the nanotube;
    forming an etch resist over the gate;
    replacing the amorphous silicon with a plurality of metal contacts, wherein a first metal contact is a source and a second metal contact is a drain; and
    depositing a passivation dielectric over the device.

2. The method of claim 1, wherein replacing the amorphous silicon with the metal contacts further comprises stripping exposed corners of the oxide exposing a portion of the amorphous silicon pillars.

3. The method of claim 2, further comprising etching the amorphous silicon pillars to exposed a backside of the oxide.

4. The method of claim 1, forming an etch resist over the gate comprises:
    forming a nitride layer over the gate; and
    forming a plurality of oxide spacers at exposed sides of the gate over the oxide layer.

* * * * *